United States Patent
Whittaker et al.

(10) Patent No.: US 11,847,534 B2
(45) Date of Patent: Dec. 19, 2023

(54) SYSTEMS AND METHODS FOR OPERATION OF A FREQUENCY MULTIPLEXED RESONATOR INPUT AND/OR OUTPUT FOR A SUPERCONDUCTING DEVICE

(71) Applicant: D-WAVE SYSTEMS INC., Burnaby (CA)

(72) Inventors: Jed D. Whittaker, Vancouver (CA); Loren J. Swenson, San Jose, CA (US); Ilya V. Perminov, Vancouver (CA); Abraham J. Evert, Vancouver (CA); Peter D. Spear, Burnaby (CA); Mark H. Volkmann, Burnaby (CA); Catia Baron Aznar, Vancouver (CA); Michael S. Babcock, Maple Ridge (CA)

(73) Assignee: D-WAVE SYSTEMS INC., Burnaby (CA)

( * ) Notice: Subject to any disclaimer, the term of this patent is extended or adjusted under 35 U.S.C. 154(b) by 376 days.

(21) Appl. No.: 17/272,052

(22) PCT Filed: Aug. 22, 2019

(86) PCT No.: PCT/US2019/047747
§ 371 (c)(1),
(2) Date: Feb. 26, 2021

(87) PCT Pub. No.: WO2020/112185
PCT Pub. Date: Jun. 4, 2020

(65) Prior Publication Data
US 2021/0350268 A1 Nov. 11, 2021

Related U.S. Application Data
(60) Provisional application No. 62/725,933, filed on Aug. 31, 2018.

(51) Int. Cl.
*G06N 10/00* (2022.01)
*G01R 33/035* (2006.01)
(Continued)

(52) U.S. Cl.
CPC ......... *G06N 10/00* (2019.01); *G01R 33/0358* (2013.01); *H03F 19/00* (2013.01); *H10N 69/00* (2023.02)

(58) Field of Classification Search
CPC .... G06N 10/00; G01R 33/0358; H03F 19/00; H10N 69/00; H03B 15/00
See application file for complete search history.

(56) References Cited

U.S. PATENT DOCUMENTS 6,373,294 B1  4/2002  Bentley
6,911,664 B2  6/2005  Il et al.
(Continued)

FOREIGN PATENT DOCUMENTS

KR  101446943 B1  10/2014
WO  2012064974 A2  5/2012
(Continued)

OTHER PUBLICATIONS

Amin et al., "First Order Quantum Phase Transition in Adiabatic Quantum Computation", arXiv:0904.1387v3, Dec. 15, 2009, 5 pages.
(Continued)

*Primary Examiner* — Alvaro E Fortich
(74) *Attorney, Agent, or Firm* — Cozen O'Connor

(57) ABSTRACT

A superconducting readout system employing a microwave transmission line, and a microwave superconducting resonator communicatively coupled to the microwave transmission line, and including a superconducting quantum interference device (SQUID), may be advantageously calibrated at least in part by measuring a resonant frequency of the
(Continued)

microwave superconducting resonator in response to a flux bias applied to the SQUID, measuring a sensitivity of the resonant frequency in response to the flux bias, and selecting an operating frequency and a sensitivity of the microwave superconducting resonator based at least in part on a variation of the resonant frequency as a function of the flux bias. The flux bias may be applied to the SQUID by an interface inductively coupled to the SQUID. Calibration of the superconducting readout system may also include determining at least one of a propagation delay, a microwave transmission line delay, and a microwave transmission line phase offset.

20 Claims, 22 Drawing Sheets

(51) Int. Cl.
*H03F 19/00* (2006.01)
*H10N 69/00* (2023.01)

(56) References Cited

U.S. PATENT DOCUMENTS

| | | | |
|---|---|---|---|
| 7,135,701 | B2 | 11/2006 | Amin et al. |
| 7,230,266 | B2 | 6/2007 | Hilton et al. |
| 7,307,275 | B2 | 12/2007 | Lidar et al. |
| 7,418,283 | B2 | 8/2008 | Amin |
| 7,533,068 | B2 | 5/2009 | Maassen et al. |
| 7,619,437 | B2 | 11/2009 | Thom et al. |
| 7,639,035 | B2 | 12/2009 | Berkley |
| 7,843,209 | B2 | 11/2010 | Berkley |
| 7,876,248 | B2 | 1/2011 | Berkley et al. |
| 7,898,282 | B2 | 3/2011 | Harris et al. |
| 7,921,072 | B2 | 4/2011 | Bohannon et al. |
| 7,932,907 | B2 | 4/2011 | Nachmanson et al. |
| 7,984,012 | B2 | 7/2011 | Coury et al. |
| 8,008,942 | B2 | 8/2011 | Van et al. |
| 8,018,244 | B2 | 9/2011 | Berkley |
| 8,035,540 | B2 | 10/2011 | Berkley et al. |
| 8,098,179 | B2 | 1/2012 | Bunyk et al. |
| 8,169,231 | B2 | 5/2012 | Berkley |
| 8,174,305 | B2 | 5/2012 | Harris |
| 8,175,995 | B2 | 5/2012 | Amin |
| 8,190,548 | B2 | 5/2012 | Choi |
| 8,195,596 | B2 | 6/2012 | Rose et al. |
| 8,283,943 | B2 | 10/2012 | Van Den Brink et al. |
| 8,421,053 | B2 | 4/2013 | Bunyk et al. |
| 8,429,108 | B2 | 4/2013 | Eusterbrock |
| 8,560,282 | B2 | 10/2013 | Love et al. |
| 8,854,074 | B2 | 10/2014 | Berkley |
| 8,874,477 | B2 | 10/2014 | Hoffberg |
| 8,972,237 | B2 | 3/2015 | Wecker |
| 9,189,217 | B2 | 11/2015 | Von Platen et al. |
| 9,588,940 | B2 | 3/2017 | Hamze et al. |
| 9,710,758 | B2 | 7/2017 | Bunyk et al. |
| 10,031,887 | B2 | 7/2018 | Raymond |
| 10,650,050 | B2 | 5/2020 | He et al. |
| 10,872,021 | B1 | 12/2020 | Tezak et al. |
| 11,062,227 | B2 | 7/2021 | Amin et al. |
| 11,087,616 | B2 | 8/2021 | Rom et al. |
| 2002/0188578 | A1 | 12/2002 | Amin et al. |
| 2003/0102470 | A1 | 6/2003 | Il et al. |
| 2003/0169041 | A1 | 9/2003 | Coury et al. |
| 2005/0008050 | A1 | 1/2005 | Fischer et al. |
| 2007/0180586 | A1 | 8/2007 | Amin |
| 2007/0239366 | A1 | 10/2007 | Hilton et al. |
| 2008/0052055 | A1 | 2/2008 | Rose et al. |
| 2009/0078931 | A1 | 3/2009 | Berkley |
| 2009/0192041 | A1 | 7/2009 | Johansson et al. |
| 2009/0259905 | A1 | 10/2009 | Silva et al. |
| 2009/0261319 | A1 | 10/2009 | Maekawa et al. |
| 2009/0289638 | A1 | 11/2009 | Farinelli et al. |
| 2010/0150222 | A1 | 6/2010 | Meyers et al. |
| 2011/0054876 | A1 | 3/2011 | Biamonte et al. |
| 2011/0057169 | A1 | 3/2011 | Harris et al. |
| 2011/0060780 | A1 | 3/2011 | Berkley et al. |
| 2011/0065586 | A1 | 3/2011 | Maibaum et al. |
| 2011/0138344 | A1 | 6/2011 | Ahn |
| 2012/0023053 | A1 | 1/2012 | Harris et al. |
| 2012/0087867 | A1 | 4/2012 | Mccamey et al. |
| 2012/0144159 | A1 | 6/2012 | Pesetski et al. |
| 2012/0265718 | A1 | 10/2012 | Amin et al. |
| 2013/0106476 | A1 | 5/2013 | Joubert et al. |
| 2013/0117200 | A1 | 5/2013 | Thom |
| 2013/0267032 | A1 | 10/2013 | Tsai et al. |
| 2014/0229722 | A1 | 8/2014 | Harris |
| 2015/0262073 | A1 | 9/2015 | Lanting |
| 2015/0286748 | A1 | 10/2015 | Lilley |
| 2015/0363708 | A1 | 12/2015 | Amin et al. |
| 2016/0079968 | A1 | 3/2016 | Strand et al. |
| 2016/0233860 | A1 | 8/2016 | Naaman |
| 2016/0238360 | A1 | 8/2016 | Naud et al. |
| 2016/0267032 | A1 | 9/2016 | Rigetti et al. |
| 2016/0364653 | A1 | 12/2016 | Chow et al. |
| 2017/0017894 | A1 | 1/2017 | Lanting et al. |
| 2017/0104695 | A1 | 4/2017 | Naaman |
| 2017/0300454 | A1 | 10/2017 | Maassen Van Den Brink et al. |
| 2017/0351967 | A1 | 12/2017 | Babbush et al. |
| 2017/0364362 | A1 | 12/2017 | Lidar et al. |
| 2018/0101786 | A1 | 4/2018 | Boothby |
| 2018/0123544 | A1* | 5/2018 | Abdo ............... H01S 1/00 |
| 2018/0145631 | A1* | 5/2018 | Berkley ............ H01P 7/08 |
| 2019/0019098 | A1 | 1/2019 | Przybysz |
| 2019/0042677 | A1 | 2/2019 | Matsuura et al. |
| 2019/0042967 | A1* | 2/2019 | Yoscovits ......... H10N 69/00 |
| 2019/0043919 | A1* | 2/2019 | George ............. G06N 10/00 |
| 2019/0266508 | A1 | 8/2019 | Bunyk et al. |
| 2019/0378874 | A1* | 12/2019 | Rosenblatt ....... H10N 60/0912 |
| 2019/0391093 | A1 | 12/2019 | Achlioptas et al. |
| 2019/0392352 | A1 | 12/2019 | Lampert et al. |
| 2020/0005155 | A1 | 1/2020 | Datta et al. |
| 2020/0183768 | A1 | 6/2020 | Berkley et al. |
| 2020/0334563 | A1 | 10/2020 | Gambetta et al. |
| 2020/0342345 | A1 | 10/2020 | Farhi et al. |
| 2020/0349326 | A1 | 11/2020 | King |
| 2020/0379768 | A1 | 12/2020 | Berkley et al. |
| 2020/0380396 | A1 | 12/2020 | Raymond |

FOREIGN PATENT DOCUMENTS

| | | | |
|---|---|---|---|
| WO | 2014123980 | A1 | 8/2014 |
| WO | 2016182608 | A2 | 11/2016 |
| WO | 2016183213 | A1 | 11/2016 |
| WO | 2017214331 | A1 | 12/2017 |
| WO | 2018064535 | A1 | 4/2018 |
| WO | 2018111242 | A1 | 6/2018 |
| WO | 2019005206 | A1 | 1/2019 |
| WO | 2019070935 | A2 | 4/2019 |
| WO | 2019168721 | A1 | 9/2019 |
| WO | 2020112185 | A2 | 6/2020 |
| WO | 2021011412 | A1 | 1/2021 |

OTHER PUBLICATIONS

Amin et al., Macroscopic Resonant Tunneling in the Presence of Low Frequency Noise, arXiv:0712.0845 [cond-mat.mes-hall], May 13, 2008, pp. 1-4.
Amin, "Effect of Local Minima on Adiabatic Quantum Optimization," Physical Review Letters 100(130503), 2008, 4 pages.
Aspuru-Guzik. "Simulated Quantum Computation of Molecular Energies", Science, Sep. 9, 2005.
Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.
Berkley, A.J. et al., "Tunneling Spectroscopy Using a Probe Qubit," arXiv:1210.6310v2 [cond-mat.supr-con], Jan. 3, 2013, 5 pages.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

(56) References Cited

OTHER PUBLICATIONS

Byrd. "A Limited-Memory Algorithm For Bound-Contrained Optimization". SIAM Journal on Scientific Computing, Jun. 17, 2005.
Dhande et al. "End-User Calibration for Quantum Annealing". Engineering Project Report—UBC, Jan. 6, 2019.
D-Wave, "Technical Description of the D-Wave Quantum Processing Unit", D-Wave User Manual 09-1109A-M, Sep. 24, 2018, 56 pages.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Harris et al., "Probing Noise in Flux Qubits via Macroscopic Resonant Tunneling", arXiv:0712.0838v2 [cond-mat.mes-hall], Feb. 8, 2008, pp. 1-4.
King et al., "Observation of topological phenomena in a programmable lattice of 1,800 qubits", arXiv:1803.02047 [quant-ph], Mar. 6, 2018, 17 pages.
Lanting et al., "Geometrical dependence of the low-frequency noise in superconducting flux qubits", Physical Review B, 79, 060509, Jun. 5, 2009, 4 pages.
Lanting et al., "Probing High Frequency Noise with Macroscopic Resonant Tunneling", arXiv:1103.1931v1 [cond-mat.supr-con], Mar. 20, 2011, 5 pages.
Lanting, T., "Observation of Co-tunneling in Pairs of Coupled Flux Qubits", arXiv:1006.0028v1 [cond-mat.supr-con], May 31, 2010, 4 pages.
Manucharyan et al., "Fluxonium: single Cooper pair circuit free of charge offsets", arXiv:0906.0831v2, [cond-mat.mes-hall] Oct. 20, 2009, 13 pages.
Nielsen. "The Fermionic canonical commutation relations and the Jordan-Wigner transform", School of Physical Sciences, Jul. 29, 2005.
Petersan et al., "Measurement of resonant frequency and quality factor of microwave resonators: Comparison of methods," Journal of Applied Physics, vol. 84, No. 6, Sep. 15, 1998, 11 pages.
Sete et al., "A Functional Architecture for Scalable Quantum Computing", 2016 IEEE International Conference on Rebooting Computing (ICRC), Oct. 17, 2016, 5 pages.
Swenson et al., "Operation of a titanium nitride superconducting microresonator detector in the nonlinear regime," arXiv:1305.4281v1 [cond-mat.supr-con], May 18, 2013, 11 pages.
Yohannes et al, "Planarized, Extensible, Multilayer, Fabrication Process for Superconducting Electronics", IEEE Transactions on Applied Superconductivity, vol. 25, No. 3, Jun. 2015.
Tolpygo et al., "Advanced Fabrication Processes for Superconducting Very Large Scale Integrated Circuits," IEEE Transactions on Applied Superconductivity 26(3):1-10, Jan. 19, 2016.
Van Harlingen et al., "Decoherence in Josephson-junction qubits due to critical current fluctuations", arXiv:cond-mat/0404307v1 [cond-mat.supr-con], Apr. 13, 2004, 24 pages.
Boothby, K., "Input/Output Systems and Methods for Superconducting Devices," U.S. Appl. No. 62/860,098, filed Jun. 11, 2019, 31 pages.
Boothby, K., et al., "Systems and Methods for Efficient Input and Output to Quantum Processors," U.S. Appl. No. 62/851,377, filed May 22, 2019, 40 pages.
Chen, Y. et al., "Multiplexed Dispersive Readout of Superconducting Phase Qubits," Applied Physics Letters 101 (182601), 2012, 4 pages.
Heinsoo, J. et al., "Rapid high-fidelity multiplexed readout of superconducting qubits," arXiv:1801.07904v1 [quant-ph], Jan. 24, 2018, 13 pages.
International Search Report & Written Opinion for PCT/US2020/041703 dated Oct. 27, 2020, 9 pages.
International Search Report for PCT/US2020/037222, dated Sep. 17, 2020, 3 pages.
Michotte, S., "Qubit Dispersive Readout Scheme with a Microstrip Squid Amplifier," arXiv:0812.0220v1 [cond-mat.supr-con], Dec. 1, 2008, 4 pages.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Written Opinion for PCT/US2020/037222, dated Sep. 17, 2020, 5 pages.
International Search Report for PCT/US2019/047747, dated Jun. 26, 2020, 4 pages.
Written Opinion for PCT/US2019/047747, dated Jun. 26, 2020, 4 pages.
Extended EP Search Report dated Jun. 26, 2023, EP App No. 20841331.0-11203—14 pages.

\* cited by examiner

SYSTEMS AND METHODS FOR OPERATION OF A FREQUENCY MULTIPLEXED RESONATOR INPUT AND/OR OUTPUT FOR A SUPERCONDUCTING DEVICE

BACKGROUND

Technical Field

This disclosure generally relates to input and/or output systems and methods for superconducting devices such as superconducting quantum computers and superconducting classical computers, and, more specifically, to systems and methods for inputting data to a superconducting quantum processor and/or measuring the state of a qubit in the superconducting quantum processor.
Frequency Multiplexed Resonant (FMR) Readout Superconducting microwave resonators have been used in a variety of fields including, but not limited to, quantum computation and astronomy. For example, in quantum computation, superconducting resonators have been used to detect the state of qubits. In astronomy, superconducting microwave resonators have been used in Microwave Kinetic Inductance Detectors (MKIDs). In both cases, many resonators (detectors) can be coupled to a common transmission line and integrated through frequency domain multiplexing. Frequency domain multiplexing (FDM) is a technique in which a communication bandwidth is divided into a number of non-overlapping sub-bands, each sub-band used to carry a separate signal.

Using FMR technology, superconducting resonators of different resonant frequencies can be used for readout of multiple qubits. The resonators can share a common microwave transmission line by using frequency domain multiplexing.

BRIEF SUMMARY

A method of operation of an apparatus, the apparatus comprising a superconducting readout system, the superconducting readout system including a microwave transmission line, a microwave superconducting resonator communicatively coupled to the microwave transmission line, the microwave superconducting resonator including a first superconducting quantum interference device (SQUID), and a first interface inductively communicatively coupled to the first SQUID, the first interface selectively operable to apply a first flux bias to the first SQUID, may be summarized as including measuring a resonant frequency of the microwave superconducting resonator in response to the first flux bias, measuring a sensitivity of the resonant frequency of the microwave superconducting resonator in response to the first flux bias, and selecting an operating frequency and a sensitivity of the microwave superconducting resonator based at least in part on a variation of the resonant frequency as a function of the first flux bias, wherein selecting an operating frequency and a sensitivity of the microwave superconducting resonator includes adjusting the first flux bias applied to the first SQUID by the first interface.

The superconducting readout system may further include a second SQUID and a second interface inductively communicatively coupled to the second SQUID, the second interface selectively operable to apply a second flux bias to the second SQUID, and the method may further include measuring a resonant frequency of the microwave superconducting resonator in response to the first and the second flux bias, measuring a sensitivity of the resonant frequency of the microwave superconducting resonator in response to the first and the second flux bias, and selecting an operating frequency and a sensitivity of the microwave superconducting resonator based at least in part on the resonant frequency and the sensitivity of the microwave superconducting resonator, wherein selecting an operating frequency and a sensitivity of the microwave superconducting resonator includes adjusting the first and the second flux bias applied to each of the first and the second SQUID by the first and the second interface respectively.

The method may further include at least approximating an operating frequency for the microwave superconducting resonator by sweeping an operating frequency band selected to include a nominal operating bandwidth of the microwave superconducting resonator. At least approximating an operating frequency for the microwave superconducting resonator by sweeping an operating frequency band may include attempting to optimize a signal power for the microwave transmission line, performing a measurement of at least one of a gain and a phase of a complex transmission response of the superconducting readout system; and determining a respective resonant frequency of the microwave superconducting resonator, wherein determining the respective resonant frequency of the microwave superconducting resonator includes at least one of finding a dip in the gain that exceeds a first threshold, and a rate of change in the phase that exceeds a second threshold. Performing a measurement of at least one of a gain and a phase to determine a respective resonant frequency of the microwave superconducting resonator may include performing a measurement of at least one of a gain and a phase using a vector network analyzer.

Sweeping an operating frequency band selected to include a nominal operating bandwidth of the microwave superconducting resonator may include configuring the first and the second SQUID of the microwave superconducting resonator in an unbiased state.

In some of the above embodiments, the superconducting readout system may further include a readout electronics digital-to-analog converter (DAC), the method may further include selecting an output power for the readout electronics DAC, and determining averaging protocol to achieve a defined signal-to-noise at the selected output power of the readout electronics DAC.

The method may further include determining at least one of a propagation delay through the superconducting readout system, a microwave transmission line delay, and a microwave transmission line phase offset. Determining a microwave transmission line delay and a microwave transmission line phase offset may include performing a frequency sweep, fitting a straight line to a measured phase as a function of frequency, estimating a microwave transmission line delay from a slope of the straight line, and estimating the phase offset from a y-intercept of the straight line.

In some of the above embodiments, the superconducting readout system may further include a cryogenic amplifier, and the method may further include calibrating the cryogenic amplifier.

In some of the above embodiments, the superconducting readout system may further include an amplifier and an attenuator, and the method may further include adjusting at least one of a gain of the amplifier and an attenuation of the attenuator to provide at least approximately linear operation of the superconducting readout system.

In some of the above embodiments, the method may further include measuring a complex transmission response of the microwave transmission line.

In some of the above embodiments, the superconducting readout system may further include a flux DAC, and the method may further include calibrating the flux DAC.

Selecting an operating frequency and a sensitivity of the microwave superconducting resonator may include selecting an operating frequency and a sensitivity of the microwave superconducting resonator by defining an objective function and attempting to optimize the objective function by adjusting the first flux bias. Attempting to optimize the objective function may include using at least one of a gradient-descent method, a Nelder-Mead method, and a Newton-Raphson method.

Selecting an operating frequency and a sensitivity of the microwave superconducting resonator may include selecting an operating frequency and a sensitivity of the microwave superconducting resonator by defining an objective function and attempting to optimize the objective function by adjusting the first and the second flux bias. Attempting to optimize the objective function may include using at least one of a gradient-descent method, a Nelder-Mead method, and a Newton-Raphson method.

Measuring a resonant frequency of the microwave superconducting resonator in response to the first flux bias may include measuring a resonant frequency by a vector-network analyzer.

Measuring a sensitivity of the resonant frequency of the microwave superconducting resonator in response to the first flux bias may include measuring a sensitivity of the resonant frequency of the microwave superconducting resonator by a current source and a vector-network analyzer (VNA).

In any of the above embodiments, the method may further include assessing performance of the superconducting readout system.

In various of the above embodiments, the method of operation may calibrate the superconducting readout system.

In various of the above embodiments, the method of operation may select an operating point for the superconducting readout system.

A computing system may be summarized as comprising at least one nontransitory processor-readable storage medium that stores at least one of processor-executable instructions or data; and at least one processor communicatively coupled to the at least one nontransitory processor-readable storage medium, the at least one processor which, in operation, performs the method of various of the above embodiments.

A nontransitory processor-readable storage medium that stores at least one of processor-executable instructions or data that, when executed by at least one processor, may be summarized as causing the at least one processor to perform the method of various of the above embodiments.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn, are not necessarily intended to convey any information regarding the actual shape of the particular elements, and have been solely selected for ease of recognition in the drawings.

DETAILED DESCRIPTION

Preamble

Figure 1A:
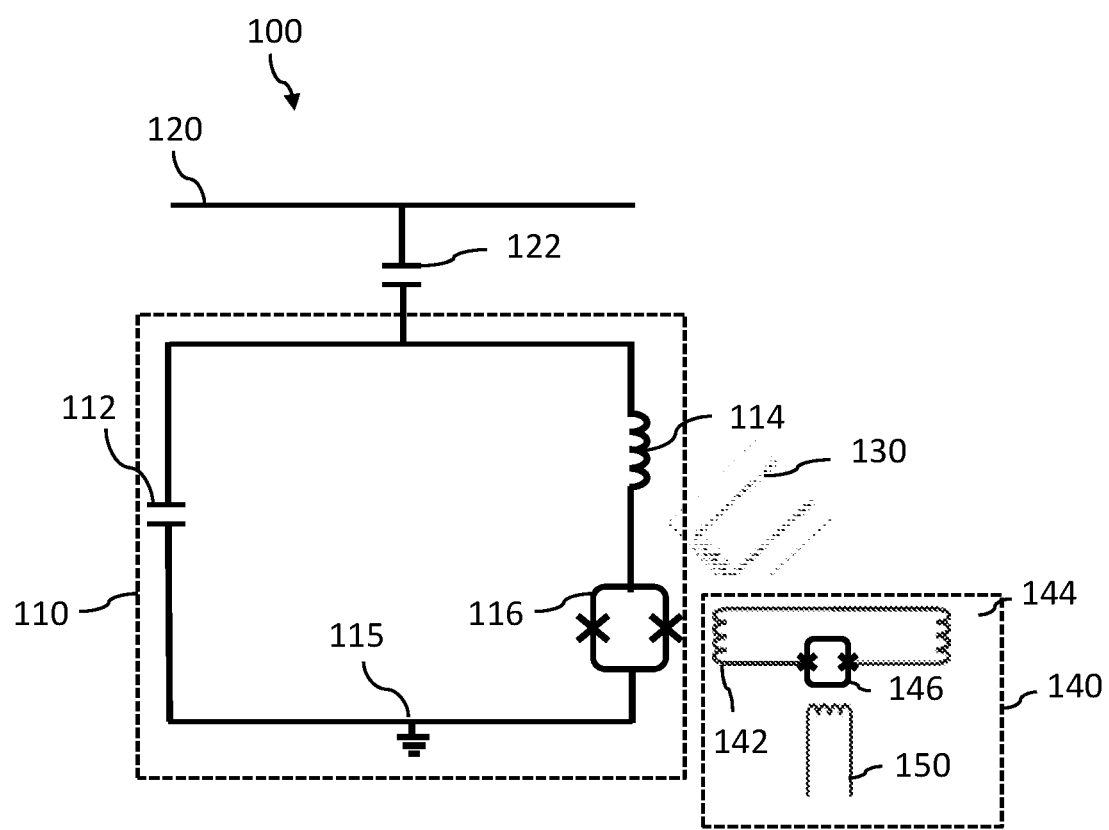
FIG. 1A is a schematic diagram illustrating an example embodiment of a superconducting circuit comprising a superconducting resonator able to tune a resonator frequency.

In the following description, some specific details are included to provide a thorough understanding of various disclosed implementations or embodiments. One skilled in the relevant art, however, will recognize that implementations or embodiments may be practiced without one or more of these specific details, or with other methods, components, materials, etc. In other instances, well-known structures associated with superconductive circuits or resonators have not been shown or described in detail to avoid unnecessarily obscuring descriptions of the implementations or embodiments of the present methods. Throughout this specification and the appended claims, the words "element" and "elements" are used to encompass, but are not limited to, all such structures, systems, and devices associated with superconductive circuits and resonators.

Unless the context requires otherwise, throughout the specification and claims which follow, the word "comprise" is synonymous with "including," and is inclusive or open-ended (i.e., does not exclude additional, unrecited elements or acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a readout system including "a superconducting resonator" includes a single superconducting resonator, or two or more superconducting resonators. It should also be noted that the term "or" is generally employed in its sense including "and/or" unless the content clearly dictates otherwise.

The headings provided herein are for convenience only and do not interpret the scope or meaning of the implementations or embodiments.

Frequency Multiplexed Resonator (FMR) Technology

Frequency Multiplexed Resonator (FMR) technology can be used to readout many single flux quanta simultaneously and has applications in both superconducting quantum computing and superconducting classical computing. FMR technology also has applications in inputting data to a superconducting quantum processor, for example via a Quantum Flux Parametron (QFP) device.

In quantum computing, it is desirable to be able to measure the state of a qubit, and it is also desirable that the readout technology is scalable to large numbers of qubits. Similarly, it is desirable for the technology for inputting data to the superconducting quantum processor to be scalable.

Scalability

The data rate of a non-dissipative readout (NDRO) in a superconducting processor (such as the NDRO described in U.S. Pat. No. 8,169,231) is constant regardless of the processor size. Consequently, the approach does not scale to large processor sizes, for example, a quantum processor having a large number of qubits or a classical superconducting processor having a large number of devices.

Though the data rate can be increased by adding more NDRO lines and associated hardware, the approach is not scalable to large numbers of qubits.

Additional NDRO lines increase the thermal load on the fridge, raising its base temperature. The increased power driven on-chip can increase the chip's heat load. Since performance of the processor can depend on low chip temperature, there can be a trade-off between processor performance and readout speed. Furthermore, adding more lines increases the cost of the hardware.

The performance of a superconducting quantum processor can be limited by the number and bandwidth of input lines. For example, in some existing implementations, the superconducting quantum processor can be accessed via approximately 200 lines each having a bandwidth of 30 MHz. The number and bandwidth of the input lines can, at least in part, determine the rate at which the system can encode new problems on the quantum processor.

Increasing the number and bandwidth of lines is not a scalable approach. Adding more lines can create a number of demands on the system including the need for a larger sample space, and the need for more contact pads on the periphery of the processor chip. Increasing the number of lines can also increase the thermal load on the processor. Moreover, an increase in the number of lines can open up more pathways for non-thermal photons.

Accordingly, there is a desire for input/output technologies which increase the rate at which data can be transmitted (or input) to the chip and received (or readout) from superconducting devices.

The present disclosure describes input/output systems and methods that are able to tune frequency and sensitivity (the change in resonant frequency per unit flux bias of the DC SQUID) independently, and consequently able to use the available bandwidth more efficiently than would typically be feasible without independent sensitivity control.

The present disclosure describes input/output systems and methods that are able to scale to large processor sizes, and provide improved performance, by increasing the rate at which data can be input and/or output to the processor without increasing the number of input/output lines to the processor.

The present disclosure describes systems and methods for calibrating FMR technology, for example, for determining operating parameters of FMR devices such as FMR transceivers.

Single SQUID Superconducting Resonator

FIG. 1A shows a superconducting circuit 100 comprising a superconducting resonator 110 according to at least a first exemplary implementation. Superconducting resonator 110 comprises a capacitance 112, and an inductance 114, which may or may not take the form of discrete capacitors and inductors, respectively.

A superconducting quantum interference device is also referred to in the present application as a SQUID. Superconducting resonator 110 further comprises a single superconducting quantum interference device (SQUID) loop 116. SQUID loop 116 is a DC SQUID and comprises a pair of Josephson junctions in parallel with one another in a superconducting loop. SQUID loop 116 enables tuning of the resonance frequency of superconducting resonator 110 by adjusting the SQUID flux bias as explained below.

The resonance frequency ω of superconducting resonator 110 can be determined by the following formula for an LC circuit:

$$\omega = \frac{1}{\sqrt{(LC)}}$$

where C is the value of capacitance 112 and L is the sum of the geometric inductance 114 and the parallel sum of the Josephson inductances from the two Josephson junctions in SQUID loop 116.

Small fluctuations in capacitance C and/or inductance L result in a fractional frequency perturbation of the resonance frequency as follows:

$$\frac{\delta\omega}{\omega} = \frac{-\delta C}{2C} + \frac{-\delta L}{2L}$$

In one implementation, superconducting resonator 110 is a distributed resonator. A distributed resonator has capacitance and inductance that cannot be isolated into separate lumped element capacitors and inductors. An advantage of a distributed resonator is that it can be designed to be insensitive to layer thickness. A distributed resonator can also be more tolerant to variations in fabrication. A distributed resonator can exhibit harmonics at every octave which can be a disadvantage in an implementation using more than one octave of bandwidth.

In other implementations, superconducting resonator 110 is a lumped element design. A lumped element design can advantageously provide a bandwidth greater than one octave, and can reduce or minimize the extent of the resonator's electric field. Since the loss tangent of superconducting resonator 110 can depend on the volume of lossy dielectric exposed to the resonator's electric field, it can be beneficial to use a lumped element design.

In a lumped element design, capacitance 112 can be implemented using one or more capacitors. The capacitors can be interdigitated capacitors and/or parallel plate capacitors. In one implementation, capacitance 112 is implemented using a parallel plate capacitor. In one example, the capacitance of the parallel plate capacitor is approximately 2 pF.

The capacitance C of a parallel plate capacitor is given by:

$$C = \frac{\epsilon A}{d}$$

where ε is the permittivity of the dielectric separating the plates, A is the area of one of the plates and d is the thickness of the dielectric.

In practice, area A may be defined by lithography, and fractional errors in area A are expected to be small relative to other errors. The thickness of the dielectric can vary and can contribute significantly to variations in capacitance C and in the resonance frequency ω of a resonator comprising capacitance C. The dependence on variations in dielectric thickness is as follows:

$$\frac{\delta\omega}{\omega} = \frac{\delta d}{2d}$$

In a lumped element design, inductance 114 can be implemented using one or more inductors. In one implementation, inductance 114 is implemented using a niobium spiral inductor. In one example, the geometric inductance of the spiral inductor is approximately 1 nH. In another implementation, inductance 114 is implemented using an inductor (e.g., a spiral inductor) comprising a high kinetic inductance material (e.g., TiN or WSi).

Energy stored in the inertia of the superconducting pairs can contribute a kinetic inductance. The total inductance in superconducting resonator 110 is a sum of the geometric inductance, the kinetic inductance, and the inductance of SQUID loop 116.

Circuit 100 further comprises a transmission line 120, a coupling capacitance 122, and a last or final shift register stage 140. Last shift register stage 140 comprises inductances 142 and 144, SQUID loop 146 and interface 150. Last or final shift register stage 140 may, for example, take the form of a Quantum Flux Parametron (QFP). Last or final shift register stage 140 is the endpoint of a shift register comprising one or more stages. Last or final shift register stage 140 is a stage that can be communicatively coupled to superconducting resonator 110 for the purposes of reading out the state of a superconducting device. In one implementation, superconducting resonator 110 is fed by a flux shift register which, in turn, is fed by a flux qubit.

The quantum flux parametron (QFP) is a superconducting Josephson junction device similar in structure to a compound rf-SQUID. The name "quantum flux parametron", however, encompasses both the operation and the structure of the Josephson junction device, not simply structure alone.

Interface 130 can provide a flux bias to SQUID loop 116 and can be controlled by a flux DAC (not shown in FIG. 1A) or by an analog line. Using a flux DAC reduces the number of low-frequency analog control lines to the superconducting circuit.

A flux DAC is an example of an on-chip control circuitry. Further examples can be found in U.S. Pat. Nos. 7,876,248; 7,843,209; 8,018,244; 8,098,179; 8,169,231; and 8,786,476.

Superconducting resonator 110 can be coupled to transmission line 120 via coupling capacitance 122 (e.g., a discrete capacitor). Transmission line 120 can optionally be coupled to one or more other superconducting resonators (not shown in FIG. 1A).

Superconducting resonator 110 is connected at node 115 to ground.

Superconducting resonator 110 comprising single SQUID loop 116 does not enable independent tuning of the resonance frequency and the sensitivity of superconducting resonator 110.

Figure 1B:
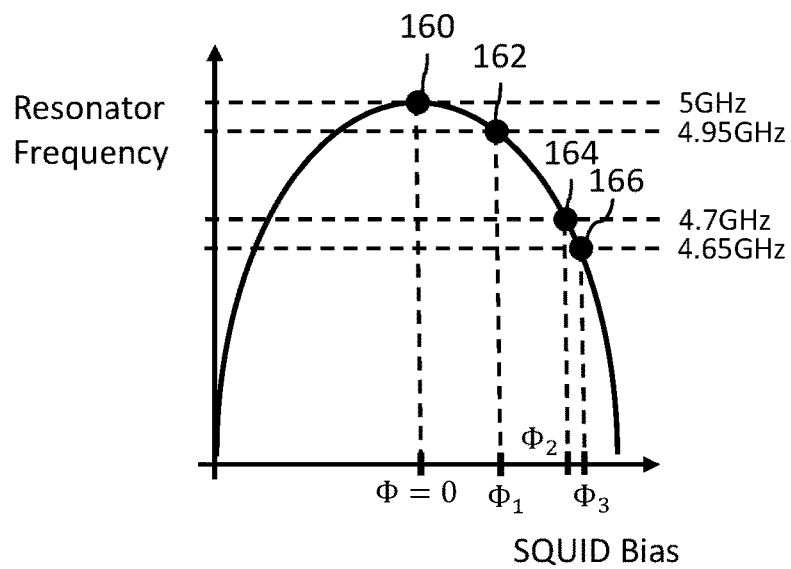
FIG. 1B is an example graph illustrating the use of SQUID flux bias to tune the resonator frequency.
Figure 1C:
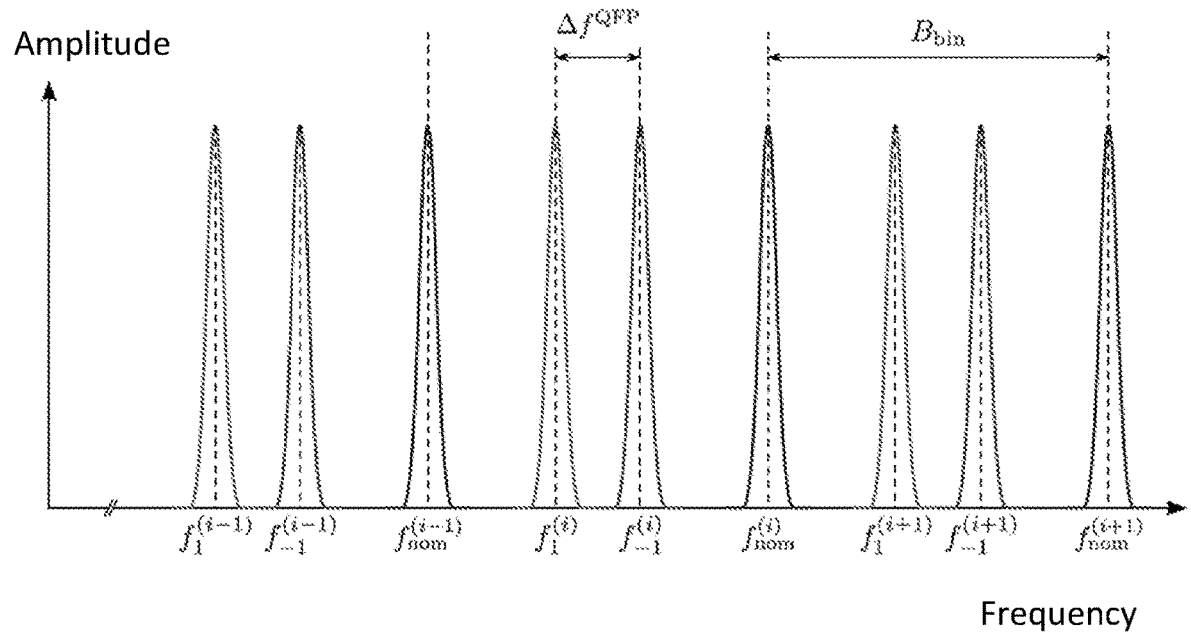
FIG. 1C is a plot illustrating schematically part of a Frequency Multiplexed Resonator (FMR) spectrum.

FIG. 1B is an example graph illustrating the variation of resonator frequency with SQUID flux bias. The SQUID flux bias can be used to tune the resonator frequency. In the example shown in FIG. 1B, the resonator frequency is 5

GHz at zero flux bias, corresponding to point 160 on the graph. Increasing the flux bias tunes the resonator down in frequency. In the example shown in FIG. 1B, the resonator can be tuned down by 50 MHz to a frequency of 4.95 GHz by increasing the flux from zero to $\Phi_1$, the result indicated by point 162 on the graph.

The sensitivity is proportional to the slope of the graph shown in FIG. 1B. Hence, a smaller increase in flux bias will cause the same frequency shift at lower frequencies. This is illustrated by points 164 and 166 on the graph shown in FIG. 1B. An increase in flux bias from $\Phi_2$ to $\Phi_3$ causes the resonator frequency to shift 50 MHz from 4.7 GHz to 4.65 GHz. The difference between $\Phi_3$ and $\Phi_2$ is less than between $\Phi_1$ and $\Phi=0$.

As mentioned previously, the sensitivity is not independently tunable and can vary significantly with flux bias. This can result in an undesirable tuning-dependent frequency shift for the same flux modulation from the last or final shift register stage coupled to the resonator. It is desirable to have a superconducting resonator in which resonator frequency and sensitivity can be independently adjusted to provide a suitable operating point. For example, independent adjustment of resonant frequency and sensitivity can be used to compensate for frequency shifts arising from variations occurring during fabrication of superconducting circuits such as circuit 100 of FIG. 1A.

Figure 10:
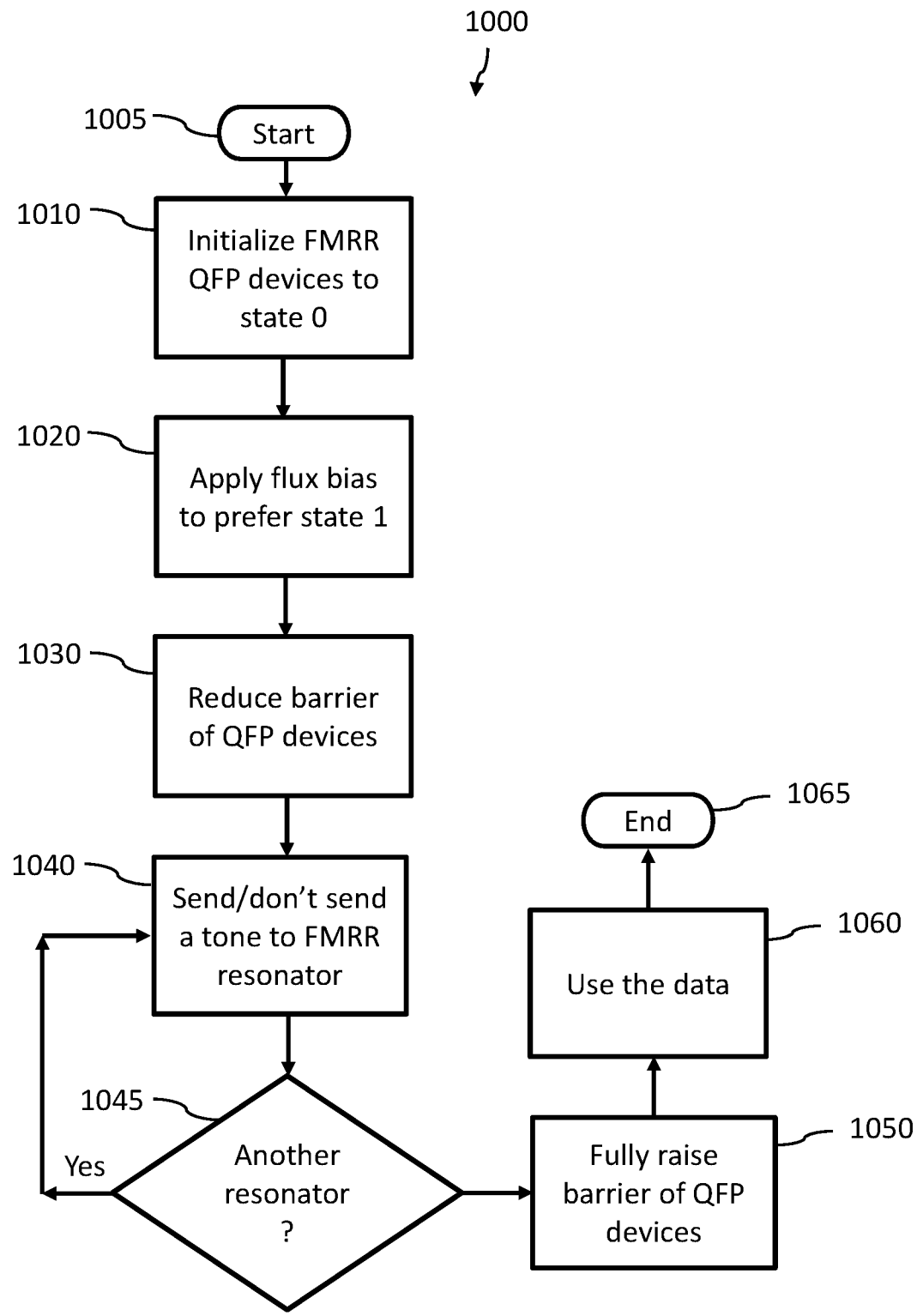
FIG. 10 is a flow chart illustrating a method for using frequency multiplexed resonator technology to transmit data to a superconducting device according to at least one implementation.

FIG. 10 is a plot illustrating schematically part of an FMR spectrum. The FMR spectrum is a plot of resonant amplitude versus frequency. The FMR spectrum comprises spectrum from three resonators shown in their various states. Frequency $f_{nom}$ is the resonator frequency when no flux bias is applied to SQUID loop 116 of FIG. 1A. Frequency $f_1$ is the resonator frequency when attached QFP 140 is in a positive latched state. Frequency $f_2$ is the resonator frequency when attached QFP 140 is in a negative latched state. The change in frequency for a given resonance between when attached QFP 140 is in a positive state and a negative state is $\Delta f^{QFP}$. Adjacent resonators are separated by frequency difference $B_{bin}$.

To guard against variations in the performance of the resonators (for example, caused by variations in fabrication), $f_{nom}^{(i)}$ can be selected to lie approximately at the center between $f_{-1}^{(i)}$ and $f_1^{(i+1)}$. Adjacent resonances can be separated by a guard band. In one implementation, adjacent resonators are separated by three times the linewidth of an individual resonance, and $B_{bin}$ is four times $\Delta f^{QFP}$. As explained below, the flux DACs for superconducting circuit 100 (not shown in FIG. 1A) can be used to position the resonances within the bandwidth to sufficient precision.

It may be desirable to achieve a dense packing of the resonances within the bandwidth. This can be achieved by positioning the resonances at regularly spaced frequencies with a determined frequency shift (i.e., sensitivity). Guard bands between resonances can be used to reduce electronic cross-talk between neighboring resonators.

Superconducting Resonator with Two SQUID Loops

Figure 2A:
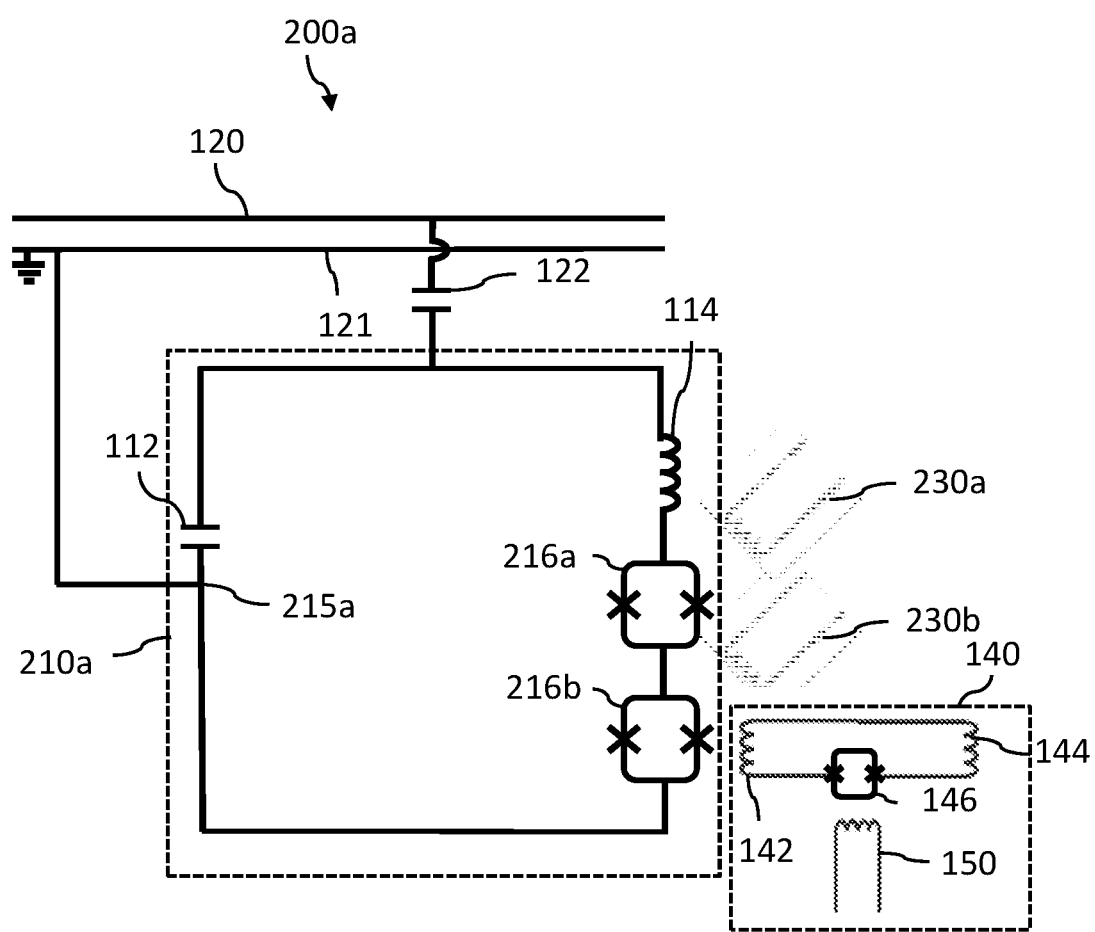
FIG. 2A is a schematic diagram illustrating a first example embodiment of a superconducting circuit comprising a superconducting resonator with two SQUID loops, able to independently tune the resonator frequency and sensitivity.

FIG. 2A shows a superconducting circuit 200a according to at least one implementation, comprising a superconducting resonator 210a with two SQUID loops, able to independently tune the resonator frequency and sensitivity. Superconducting resonator 210a comprises two SQUID loops 216a and 216b. Each of SQUID loops 216a and 216b is a DC SQUID and comprises a pair of Josephson junctions in parallel with one another in a superconducting loop. SQUID loops 216a and 216b advantageously enable independent tuning of the resonance frequency and the sensitivity of superconducting resonator 210a by adjusting the flux bias in SQUID loops 216a and 216b as explained below.

SQUID loop 216a is also referred to in the present application as a TUNE SQUID. SQUID loop 216b is also referred to in the present application as a SENSE SQUID.

Components of superconducting circuit 200a labeled with the same numbers as in superconducting circuit 100 of FIG. 1A are similar or even identical to those described in reference to FIG. 1A. For example, capacitance 112 of superconducting circuit 200a can be a parallel plate capacitor, and inductance 114 of superconducting circuit 200a can be a niobium spiral inductor. Inductance 114 can be implemented using an inductor (e.g., a spiral inductor) comprising a high kinetic inductance material (e.g., TiN or WSi). Superconducting resonator 210a is connected at node 215a to ground, for example to the ground 121 of transmission line 120.

Interfaces 230a and 230b can provide flux bias to SQUID loops 216a and 216b respectively. Once a suitable operating point has been found (see below), the flux biases provided by interfaces 230a and 230b can be static. This advantageously allows the circuit to use an array of flux DACs requiring only a few wires to program. The two tunable SQUID loops 216a and 216b do not need an independent analog control line for each superconducting resonator 210a.

Figure 2B:
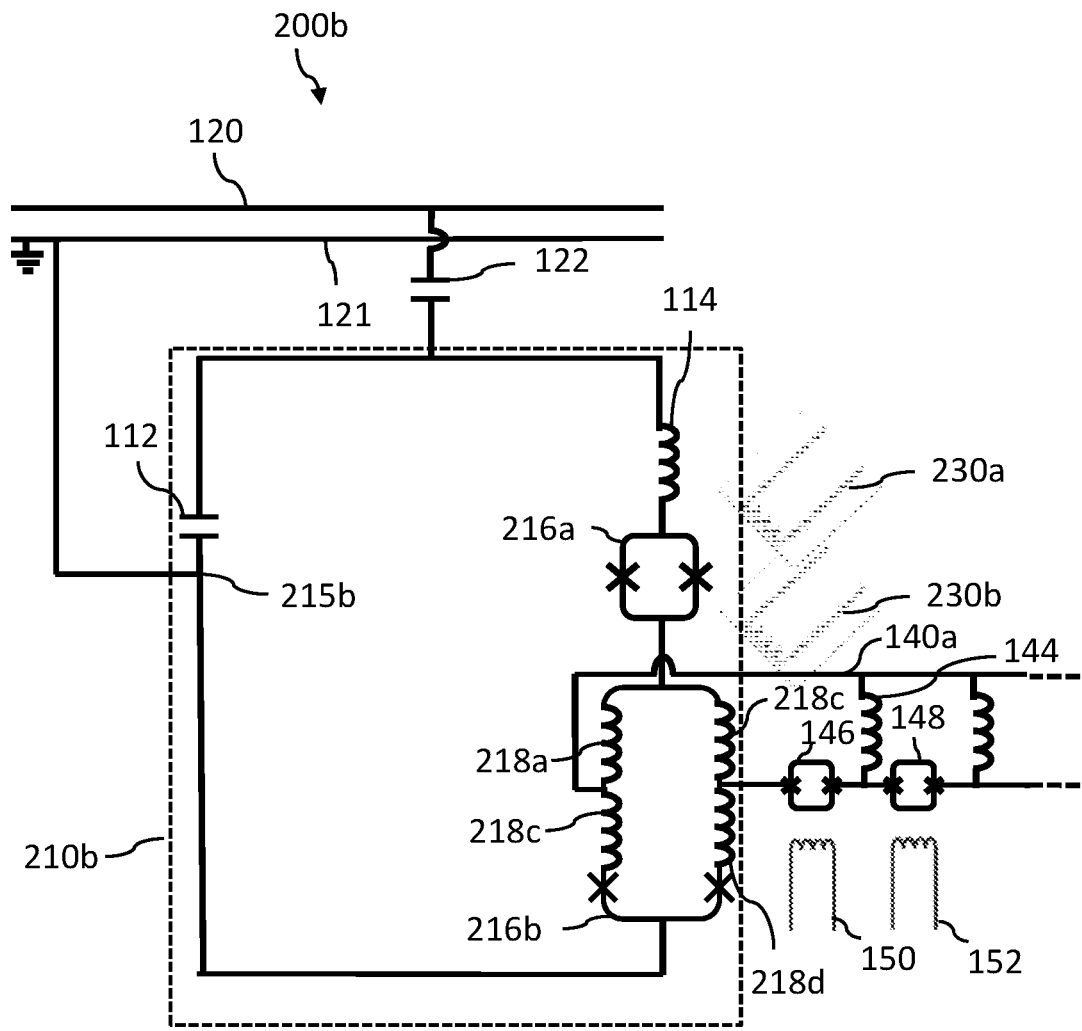
FIG. 2B is a schematic diagram illustrating a second example embodiment of a superconducting circuit comprising a superconducting resonator with two SQUID loops, able to independently tune the resonator frequency and sensitivity.

FIG. 2B shows a superconducting circuit 200b according to at least another implementation, comprising a superconducting resonator 210b with two SQUID loops, advantageously operable to independently tune the resonator frequency and sensitivity. Superconducting resonator 210b comprises two SQUID loops 216a and 216b. Each of SQUID loops 216a and 216b is a DC SQUID and comprises a pair of Josephson junctions in parallel in a superconducting loop. SQUID loop 216b further comprises inductances 218a through 218d. SQUID loops 216a and 216b enable independent tuning of the resonance frequency and the sensitivity of superconducting resonator 210a by adjusting the flux bias in SQUID loops 216a and 216b as explained below.

SQUID loop 218b is galvanically coupled to a last or final shift register stage comprising DC SQUID 146 and inductance 144. Interfaces 150 and 152 can provide flux bias to DC SQUIDs 146 and 148 respectively. Superconducting resonator 210b is connected at node 215b to ground, for example to the ground 121 of transmission line 120.

Components of superconducting circuit 200b labeled with the same numbers as in superconducting circuit 100 of FIG. 1A are similar or even identical to those described in reference to FIG. 1A. For example, capacitance 112 of superconducting circuit 200b can be a parallel plate capacitor, and inductance 114 of superconducting circuit 200b can be a niobium spiral inductor. Inductance 114 can be implemented using an inductor (e.g., a spiral inductor) comprising a high kinetic inductance material (e.g., TiN or WSi).

Interfaces 230a and 230b can provide flux bias to SQUID loops 216a and 216b respectively.

Figure 2C:
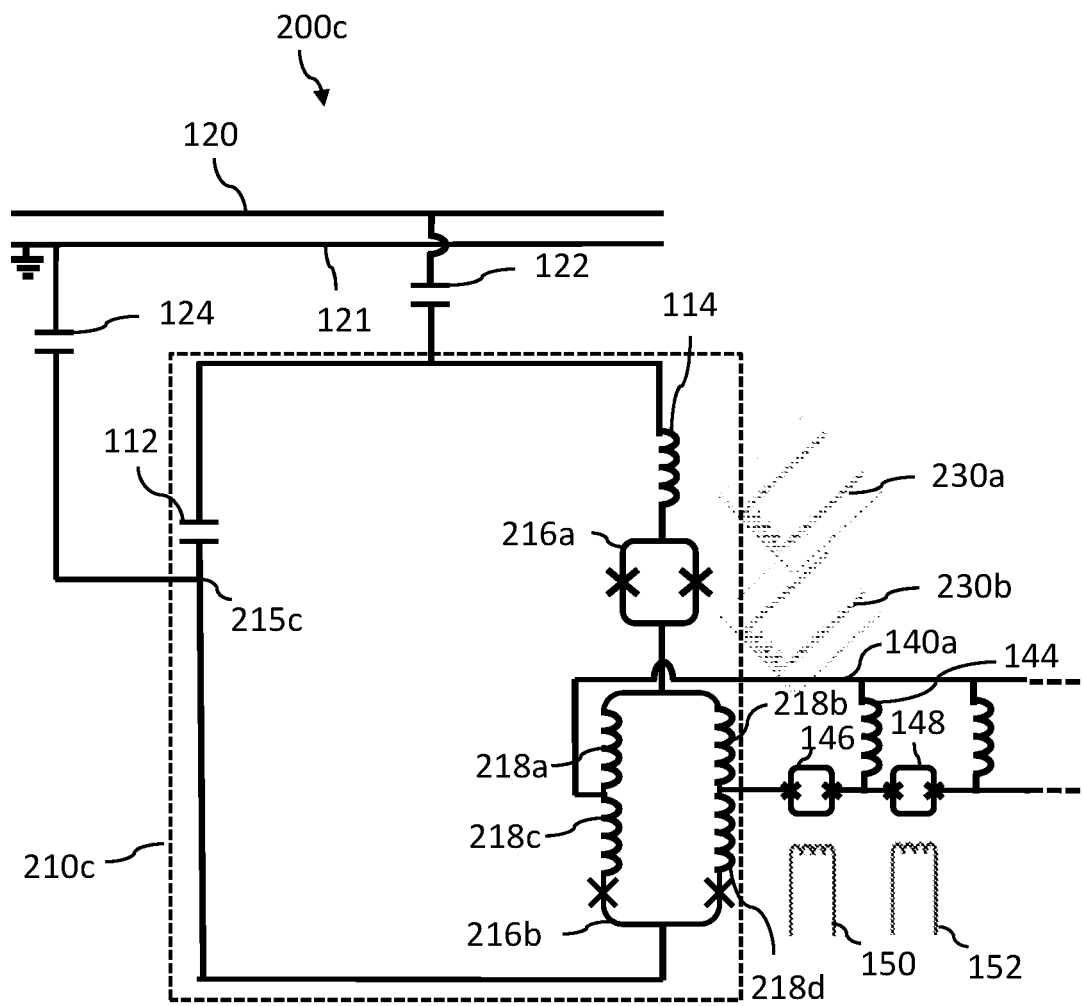
FIG. 2C is a schematic diagram illustrating a third example embodiment of a superconducting circuit comprising a superconducting resonator with two SQUID loops, able to independently tune the resonator frequency and sensitivity.

FIG. 2C shows a superconducting circuit 200c according to at least another implementation, comprising a superconducting resonator 210c with two SQUID loops, advantageously operable to independently tune the resonator frequency and sensitivity. Superconducting circuit 200c is connected at node 215c to the ground 121 of transmission line 120 via a coupling capacitor 124. In other respects, superconducting circuit 200c is the same as or similar to superconducting circuit 200b.

Components of superconducting circuit 200c labeled with the same numbers as in superconducting circuit 100 of FIG.

1A can be as described in reference to FIG. 1A. For example, capacitance 112 of superconducting circuit 200a can be a parallel plate capacitor, and inductance 114 of superconducting circuit 200c can be a niobium spiral inductor. Inductance 114 can be implemented using an inductor (e.g., a spiral inductor) comprising a high kinetic inductance material (e.g., TiN or WSi).

Independent Tuning of Frequency and Sensitivity Using Two SQUID Loops

As previously discussed, a superconducting resonator comprising a fixed geometric inductance, a capacitance and a single SQUID loop (such as superconducting resonator 110 of FIG. 1A) does not enable independent tuning of resonance frequency and sensitivity. As described above with reference to FIGS. 2A, 2B and 2C, adding a second SQUID loop to the superconducting resonator provides an additional degree of freedom, and enables independent tuning of resonance frequency and sensitivity.

Figure 3:
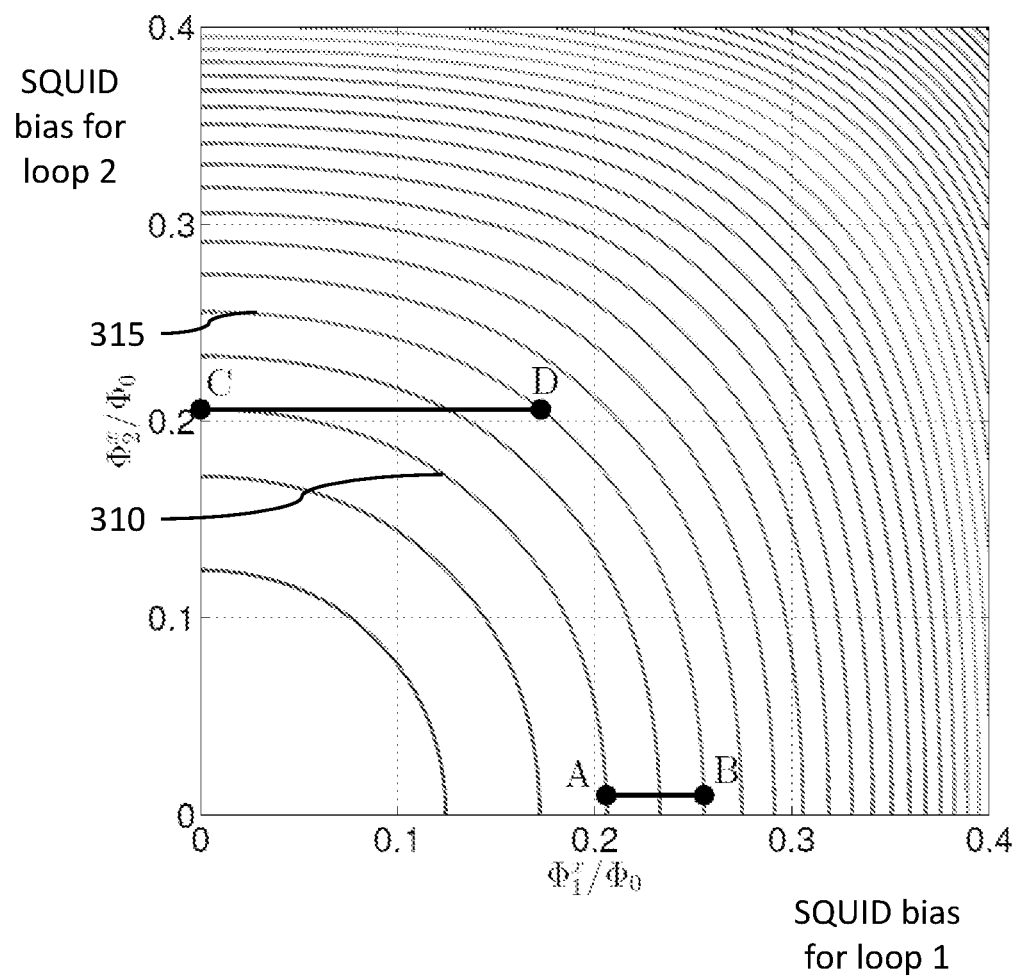
FIG. 3 is a plot of the modulation curve for a superconducting circuit comprising a superconducting resonator with two SQUID loops such as the superconducting circuit of FIG. 2A.

FIG. 3 is a plot of the modulation curve for a superconducting circuit comprising a superconducting resonator with two SQUID loops such as the superconducting circuit of FIG. 2A. Plot 300 shows contours of constant frequency including example contours 310 and 315. Plot 300 includes a first axis denoting the flux bias in a first SQUID loop, and a second axis denoting the flux bias in a second SQUID loop.

In FIG. 3, the frequency at the origin of the plot is 4.932 GHz. Contours 310 and 315 are at 4.926 GHz and 4.922 GHz respectively, separated by 4 MHz. Flux sensitivity can be adjusted by changing location of an operating point of superconducting circuit 200a along a given contour of constant frequency. Since only one of the two SQUID loops 216a and 216b of FIG. 2A is coupled to last or final shift register stage 140, a change in the shift register state results in either a vertical shift or a horizontal shift in plot 300 of FIG. 3. The direction of the shift depends on which SQUID loop (216a or 216b) is coupled to last or final shift register stage 140. In FIG. 2A, SQUID loop 216b is coupled to last or final shift register 140, and the shift will be in the horizontal direction, i.e., parallel to the x-axis of plot 300 of FIG. 3.

The change in flux bias required to cause a given frequency shift will depend on the location of the operating point on the contour. For example, a horizontal shift from location A on contour 310 to location B on contour 315 requires a smaller change in flux bias than a shift from location C on contour 310 to location D on contour 315. The frequency shift is the same in both cases. The frequency shift per unit flux bias is known as the sensitivity. The sensitivity is greater when the operating point is at location A on contour 310 than at location C on location 310.

A suitable operating point can be established by the method described in the following paragraphs. The SQUID bias for loop 216a is denoted by $\Phi_a$ and the SQUID bias for loop 216b is denoted by $\Phi_b$.

Firstly, $\Phi_a$ is kept at zero while $\Phi_b$ is increased from zero until a desired operating frequency is found. The shift register is then operated and the frequency shift between the two possible states (i.e., the flux sensitivity) is measured. The process is then repeated while $\Phi_b$ is kept at zero and $\Phi_a$ is increased from zero until the desired operating frequency is achieved. The flux sensitivity is again measured. If a desired flux sensitivity lies between the bounds set by the first two measurements described above, then an iterative approach can be used to find the preferred operating point. The calibration process to determine the preferred operating point steps through possible values of $\Phi_b$, adjusting $\Phi_a$ to achieve the desired frequency and then measuring sensitivity. In one implementation, a binomial search can be used to determine the preferred values of $\Phi_a$ and $\Phi_b$. In other implementations, other suitable search methods can be used.

Single SQUID Loop with Tunable Coupler

Figure 4:
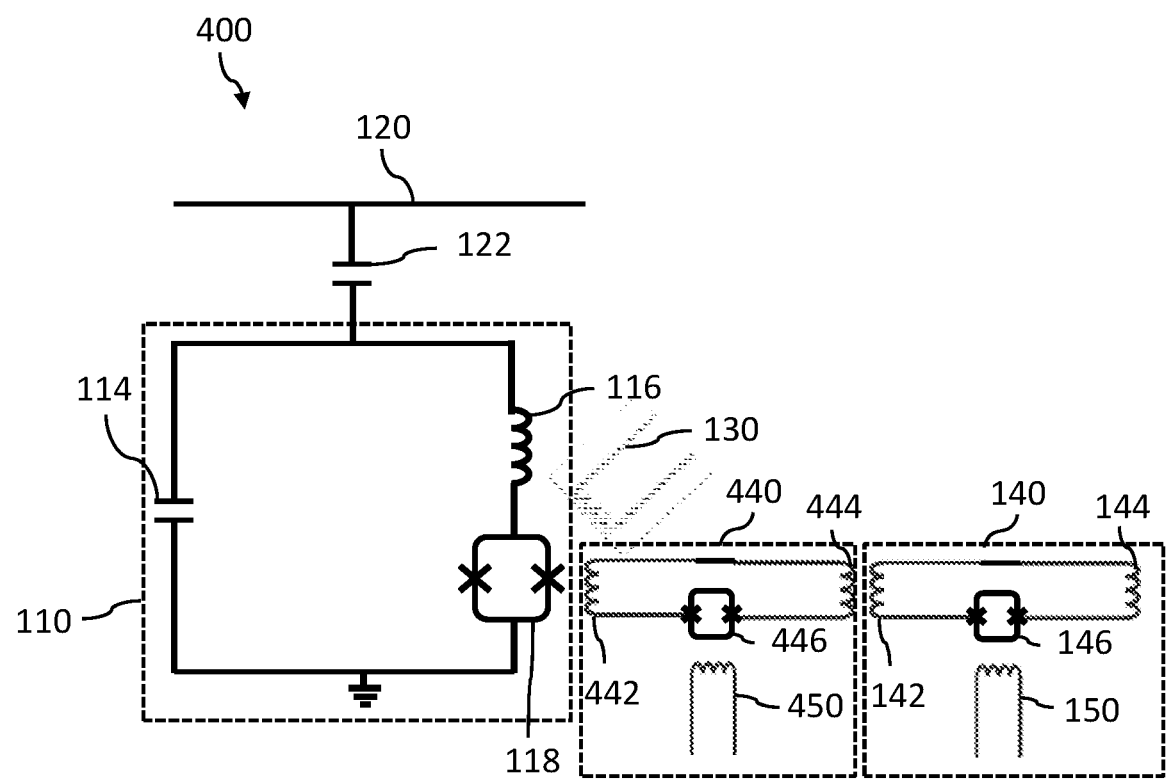
FIG. 4 is a schematic diagram illustrating an example embodiment of a superconducting circuit comprising the superconducting resonator of FIG. 1A and able to independently tune the resonator frequency and sensitivity.

FIG. 4 shows a superconducting circuit 400 according to at least one implementation, comprising superconducting resonator 110 of FIG. 1A and advantageously operable to independently tune the resonator frequency and sensitivity. Superconducting circuit further comprises interface 130 and last or final shift register stage 140, both as described with reference to FIG. 1A.

Superconducting circuit 400 further comprises a tunable coupler 440 in between superconducting resonator 110 and last or final shift register stage (or QFP) 140. Superconducting circuit 400 enables independent tuning of the resonance frequency and the sensitivity to QFP flux, provided the variable loading of superconducting resonator 110 by tunable coupler 440 is taken into account.

Tunable coupler 440 comprises inductances 442 and 444, and DC SQUID 446. Superconducting circuit 400 further comprises interface 450.

Readout System

Figure 5:
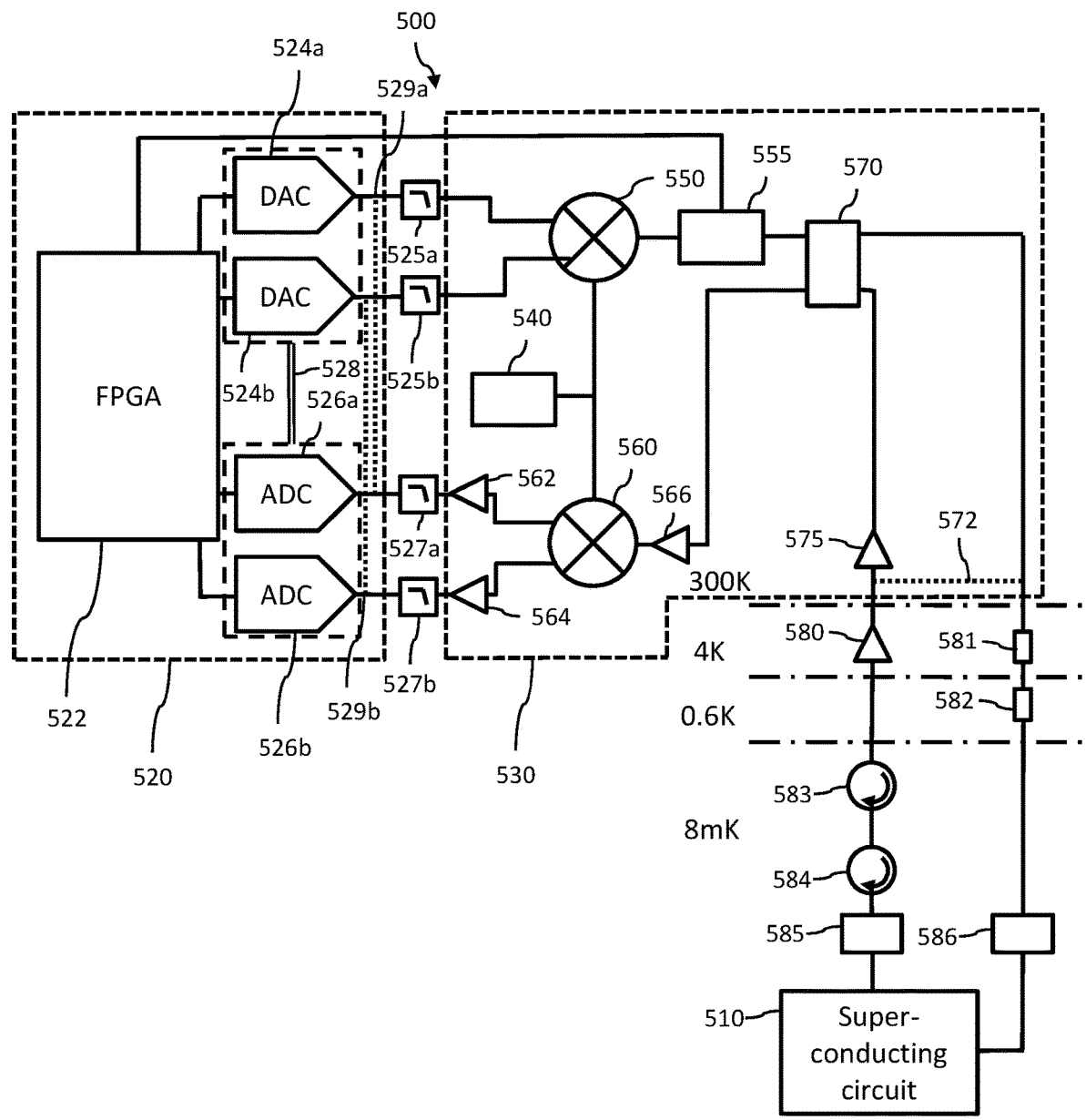
FIG. 5 is a schematic diagram illustrating an example embodiment of a readout system for a superconducting circuit.

FIG. 5 shows a readout system 500 for a superconducting circuit 510 according to at least one exemplary implementation. In the illustrated implementation, superconducting circuit 510 comprises one or more superconducting resonators (not shown in FIG. 5) such as superconducting resonator 210a of FIG. 2A. In the illustrated implementation, superconducting circuit 510 comprises a superconducting quantum processor. In other implementations, superconducting circuit 510 comprises a superconducting classical processor.

Readout system 500 comprises a digital board 520 and a microwave board 530. Digital board 520 comprises a digital processor 522, two Digital-to-Analog Converters (DACs) 524a and 524b, and two Analog-to-Digital Converters (ADCs) 526a and 526b. In one implementation digital processor 522 is a Field Programmable Gate Array (FPGA). Digital processor 522 may be any logic processing unit, such as one or more central processing units ("CPUs") with one or more cores, graphics processing units ("GPUs"), digital signal processors ("DSPs"), application-specific integrated circuits ("ASICs"), field-programmable gate arrays ("FPGAs"), programmable logic controllers (PLCs), etc.

In other embodiments, digital board 520 comprises two digital processors, such as two FPGAs, one providing output to DACs 524a and 524b, and the other providing output to ADCs 526a and 526b. In one implementation, each of DACs 524a and 524b is implemented using a dual-channel 14-bit DAC operating at up to about 5.6 Gsps (Giga samples per second). ADCs 526a and 526b can be implemented using a multi-channel device such as a quad-channel 10-bit ADC capable of operating in dual-channel mode at up to about 2.5 Gsps.

Readout system 500 advantageously enables independent addressing of the two side-bands of the FMR spectrum. The complex received signal is given by:

$$x(n) = I(n) + jQ(n)$$

where I(n) is the output of ADC 526a and Q(n) is the output of ADC 526b.

The FMR spectrum is computed as follows:

$$X_k = \frac{1}{N} \sum_{n=0}^{N-1} x(n) \left[ \cos\left(\frac{2\pi k n}{N}\right) - j\sin\left(\frac{2\pi k n + 2\pi k \tau}{N}\right) \right]$$

for k∈0, 1, 2, 3 . . . N−1. The second term in the argument of the sine function depends on z and can be used to compensate for the phase imbalance between the two mixer channels that results from the analog nature of the mixer.

Digital board 520 further comprises two loopback lines 529a and 529b, and a sync/clock connection 528. Loopback line 529a connects the output of DAC 524a to the input of ADC 526a. Loopback line 529b connects the output of DAC 524b to the input of ADC 526b.

Microwave subsystem or microwave board 530 further comprises a loopback line 572. Loopback line 572 connects the input and output to cryogenic subsystem (not shown in FIG. 5) used to cool superconducting device 510 to temperatures as low as a few mK.

Loopback lines 529a and 529b on digital board 520, and loopback line 572 on microwave board 530 are optional, and used when required to bypass other elements of readout system 500.

Readout system 500 further comprises two reconstruction filters 525a and 525b, and two anti-aliasing filters 527a and 527b. Reconstruction filters 525a and 525b are low-pass analog filters that can be used to produce a band-limited analog signal from a digital input. Anti-aliasing filters 527a and 527b are low-pass analog filters that can be used to band-limit a received signal in order to at least reduce aliasing of the received signal when the received signal is sampled. The band-limited received signal may be sampled, for example, at the Nyquist rate i.e., at twice the bandwidth of the band-limited received signal.

Microwave board 530 comprises a Voltage-Controlled Oscillator (VCO)/Phase Locked Loop (PLL) 540 which provides a reference microwave signal, mixers 550 and 560, and programmable attenuators 570. Microwave board 530 further comprises amplifiers 562, 564, 566 and 575. Amplifiers 562, 564, 566 and 575 can be used to provide level control on the signal received from superconducting circuit 510. Microwave board 530 further comprises a microwave switch 555 controlled by a signal from FPGA 522 on digital board 520.

In one implementation, mixers 550 and 560 are complex mixers.

The illustrated readout system 500 further comprises amplifier 580, attenuators 581 and 582, circulators 583 and 584, and DC blocks 585 and 586. DC blocks 585 and 586 are used as a thermal break on each of the input and output lines to superconducting circuit 510.

In one implementation, amplifier 580 and attenuator 581 is able to operate at 4 K, attenuator 582 is able to operate at 0.6 K, and circulators 583 and 584, and DC blocks 585 and 586, are able to operate at 8 mK.

Using 60 resonators and a bandwidth of 2.5 GHz, a data rate of approximately 600 Mbps can be achieved for a shift register stage (SRS) operation time of 25 ns.

Method of Operation of Readout System

Figure 6:
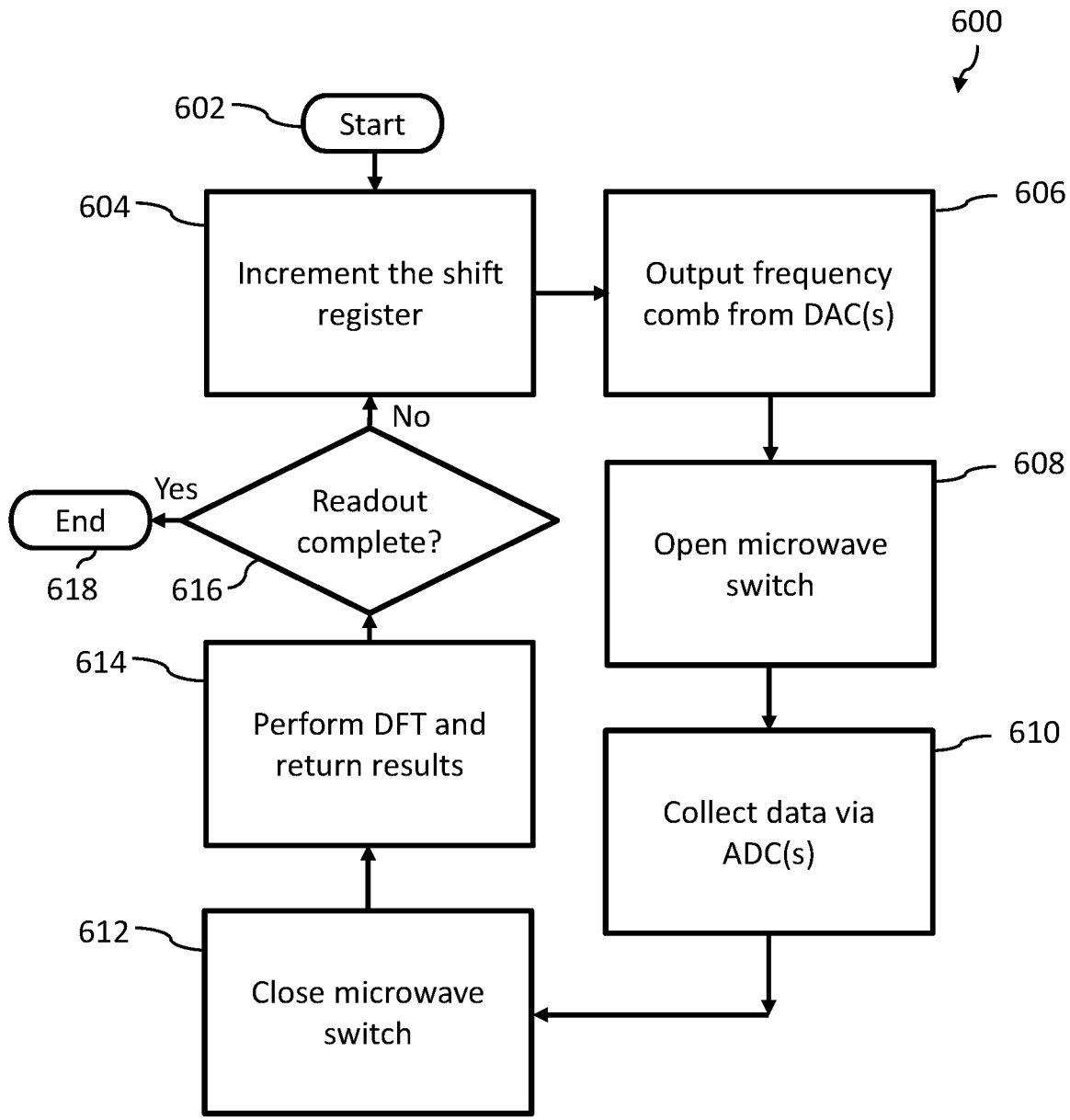
FIG. 6 is a flow chart illustrating a method of operation of the readout system of FIG. 5.

FIG. 6 shows a method 600 of operation of readout system 500 of FIG. 5, according to at least one implementation. Method 600 starts at 602, for example in response to a powering up of readout system 500 or invocation of a routine. At 604, readout system 500 provides a flux signal for readout. In one implementation, readout system 500 increments the shift register (not shown in FIG. 5) at 604. At 606, readout system 500 outputs a frequency comb from a DAC or DACs (e.g., DACs 524a and 524b). At 608, readout system 500 opens microwave switch 555. At 610, readout system 500 collects data via an ADC or ADCs (e.g., ADCs 526a and 526b). At 612, readout system 500 closes microwave switch 555. At 614, FPGA 522 performs a DFT on the data output by ADCs 526a and 526b, and returns the values of the FMR spectrum (e.g., returns values from FPGA 522). Method 600 loops through 604 to 614 until readout system 500 determines at 616 the readout is complete, and then ends at 618 until invoked again.

FMR Technology for Superconducting Qubits

Figure 7:
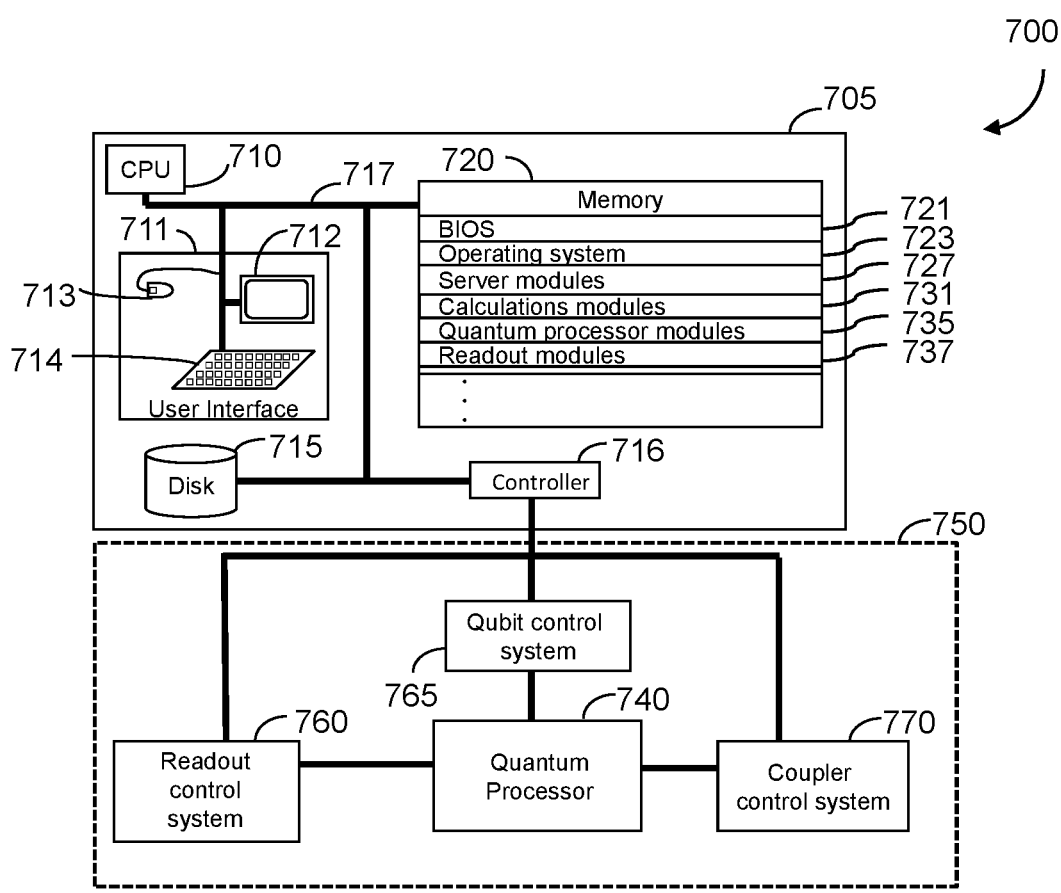
FIG. 7 is a schematic diagram of an exemplary hybrid computing system, including a digital computer and a quantum computer, that may incorporate FMR technology as described herein.

FIG. 7 shows a hybrid computing system 700 according to at least one exemplary implementation, including a digital computer 705 and a quantum computer 750, that may incorporate FMR technology as described above.

Digital computer 705 comprises CPU 710, user interface elements 711, 712, 713 and 714, disk 715, controller 716, bus 717 and memory 720. Memory 720 comprises modules 721, 723, 727, 731, 737 and 735.

Quantum computer 750 comprises quantum processor 740, readout control system 760, qubit control system 765 and coupler control system 770. Quantum computer 750 can incorporate FMR technology comprising superconducting resonators (such as superconducting resonator 210a of FIG. 2A). Computing system 700 can comprise a readout system such as readout system 500 of FIG. 5. Quantum processor 740 can be a superconducting quantum processor.

Figure 8:
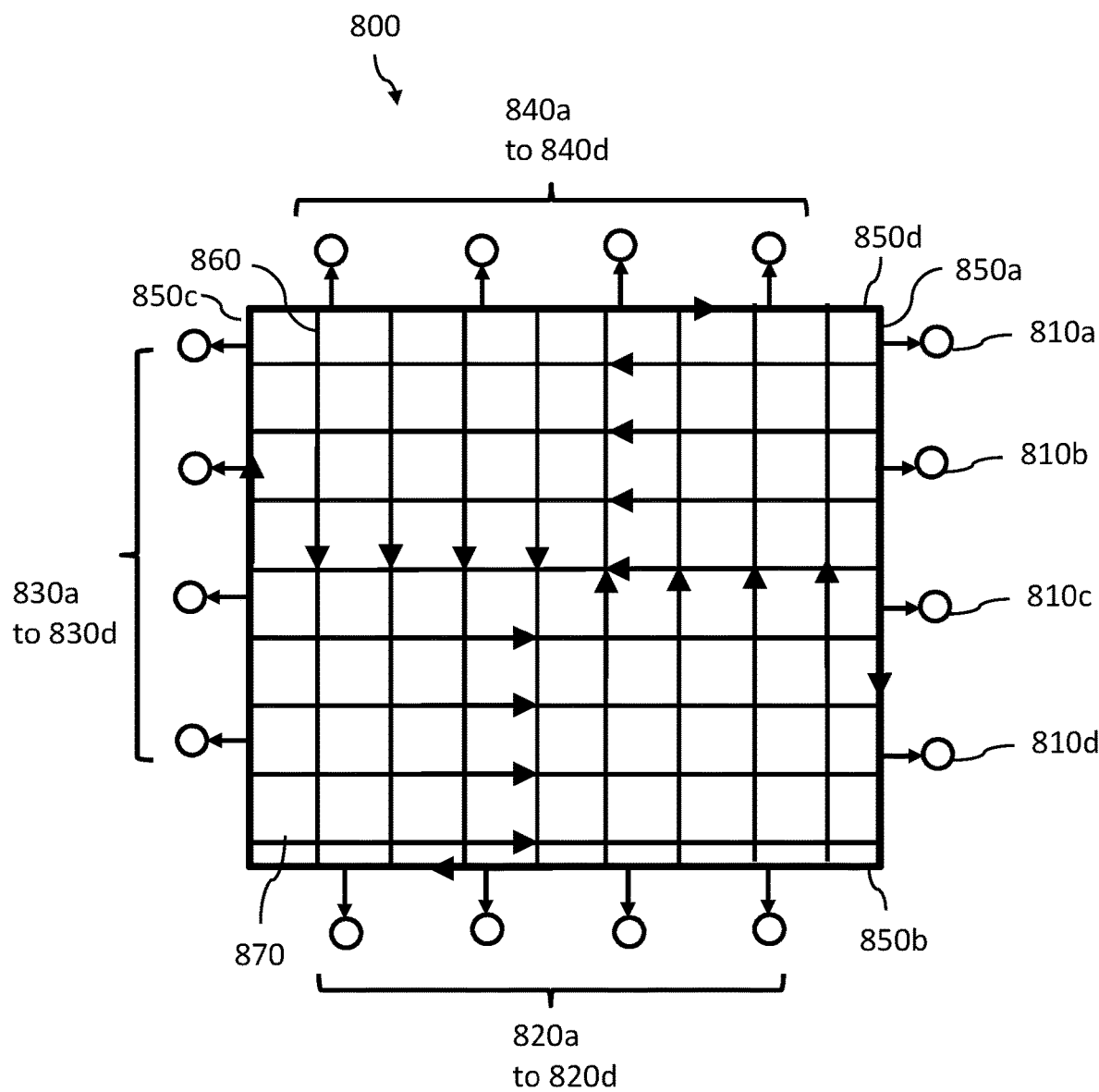
FIG. 8 is a schematic diagram illustrating a first arrangement of superconducting resonators in an example embodiment of a superconducting quantum processor.

FIG. 8 shows a first arrangement of superconducting resonators in an example implementation of a superconducting quantum processor 800. Processor 800 comprises 64 cells (not shown in FIG. 8) with four sets of superconducting resonators 810a through 810d, 820a through 820d, 830a through 830d, and 840a through 840d, coupled to outer shift registers 850a through 850d respectively. Each cell comprises N qubits. In one implementation, N=8. Processor 800 comprises eight vertically oriented inner shift registers 860 and eight horizontally oriented inner shift registers 870.

All four set of superconducting resonators 810a through 810d, 820a through 820d, 830a through 830d, and 840a through 840d are coupled to a single common transmission line such as line 120 of FIG. 2A (not shown in FIG. 8).

In another implementation, a superconducting quantum processor comprises less than 64 cells. In yet another implementation, a superconducting quantum processor comprises more than 64 cells.

Figure 9:
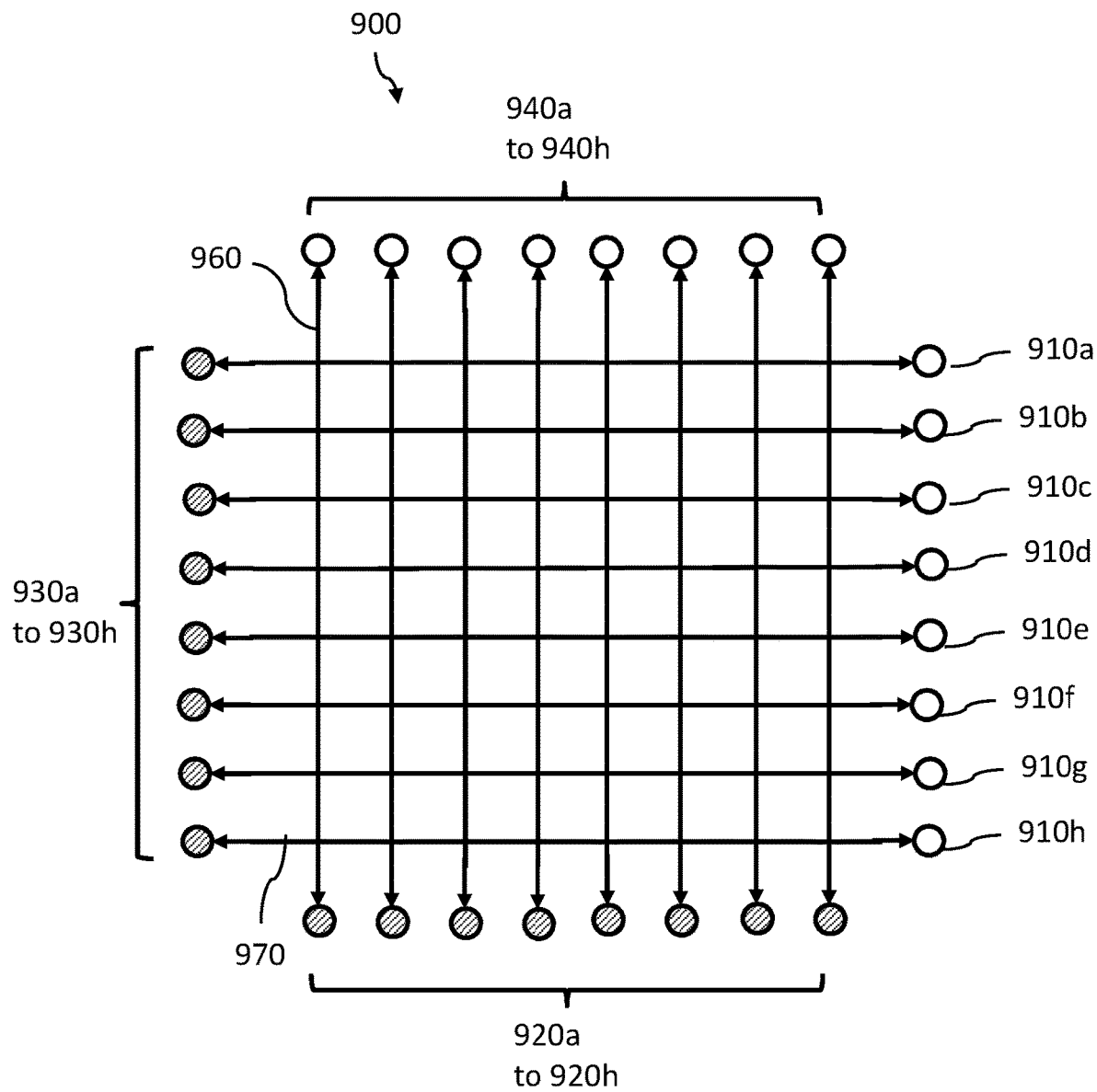
FIG. 9 is a schematic diagram illustrating a second arrangement of superconducting resonators in an example embodiment of a superconducting quantum processor.

FIG. 9 shows a second arrangement of superconducting resonators in an example implementation of a superconducting quantum processor 900. Processor 900 comprises 64 cells (not shown in FIG. 9) with four sets of superconducting resonators 910a through 910h, 920a through 920h, 930a through 930h and 940a through 940h. Each cell comprises N qubits. In one implementation, N=8. Processor 900 comprises eight vertically oriented inner shift registers 960 and eight horizontally oriented inner shift registers 970.

Two sets of superconducting resonators 910a through 910h and 940a through 940h are coupled to a first transmission line such as line 120 of FIG. 2A (not shown in FIG. 9). The other two sets of superconducting resonators 920a through 920h and 930a through 930h (shown shaded in FIG. 9) are coupled to a second transmission line (also not shown in FIG. 9).

In the arrangement illustrated in FIG. 9, outer shift registers (such as outer shift registers 850a through 850d of FIG. 8) are not needed. With eight resonators on a side, one for each of the inner shift registers (horizontal or vertical), there is sufficient fault tolerance provided by the cross-over stages of the horizontally and vertically oriented inner shift registers.

Frequency Multiplexed Resonator Transceiver

FIG. 10 is a flow chart illustrating a method 1000 for using frequency multiplexed resonator technology to transmit data to a superconducting device, according to at least one exemplary implementation. The superconducting device can, for example, be an element of a superconducting classical processor. Alternatively, the superconducting device can, for example, be an element of a superconducting quantum processor.

In one implementation, method 1000 is executed by a computing system, such as a hybrid computing system comprising a digital computer and an analog computer. Method 1000 includes acts 1005-1065, though those skilled in the art will appreciate that in alternative implementations certain acts may be omitted and/or additional acts may be added. Those skilled in the art will appreciate that the order of the acts is shown for exemplary purposes only and may change in alternative implementations.

At 1010, the computing system initializes the QFP devices to a "0" state. At 1020, the computing system applies a flux bias using a flux bias line such as flux bias line 155 of FIGS. 12 through 14 to create a preference for a "1" state. At 1030, the computing system reduces the barrier of the QFP devices. At 1040, the computing system decides whether to send a tone to a frequency multiplexed resonator, and, if so, sends the tone to the resonator. The presence of a tone allows the QFP to relax into the "1" state. The absence of a tone causes the QFP to stay in the "0" state.

At 1045, the computing system determines if there is another resonator. If the computing system determines there is another resonator at 1045, then method 1000 returns to 1040. Method 1000 successively loops around 1040 and 1045 until there are no more resonators to consider, and method 1000 proceeds to 1050.

At 1050, the computing system fully raises the barrier of each of the QFP devices. At 1060, the quantum processor uses the data, for example through classical QFP logic. Using the data can include transferring the data to a superconducting processor via a shift register, for example. Method 1000 ends at 1065, for example until called or invoked again.

Figure 11:
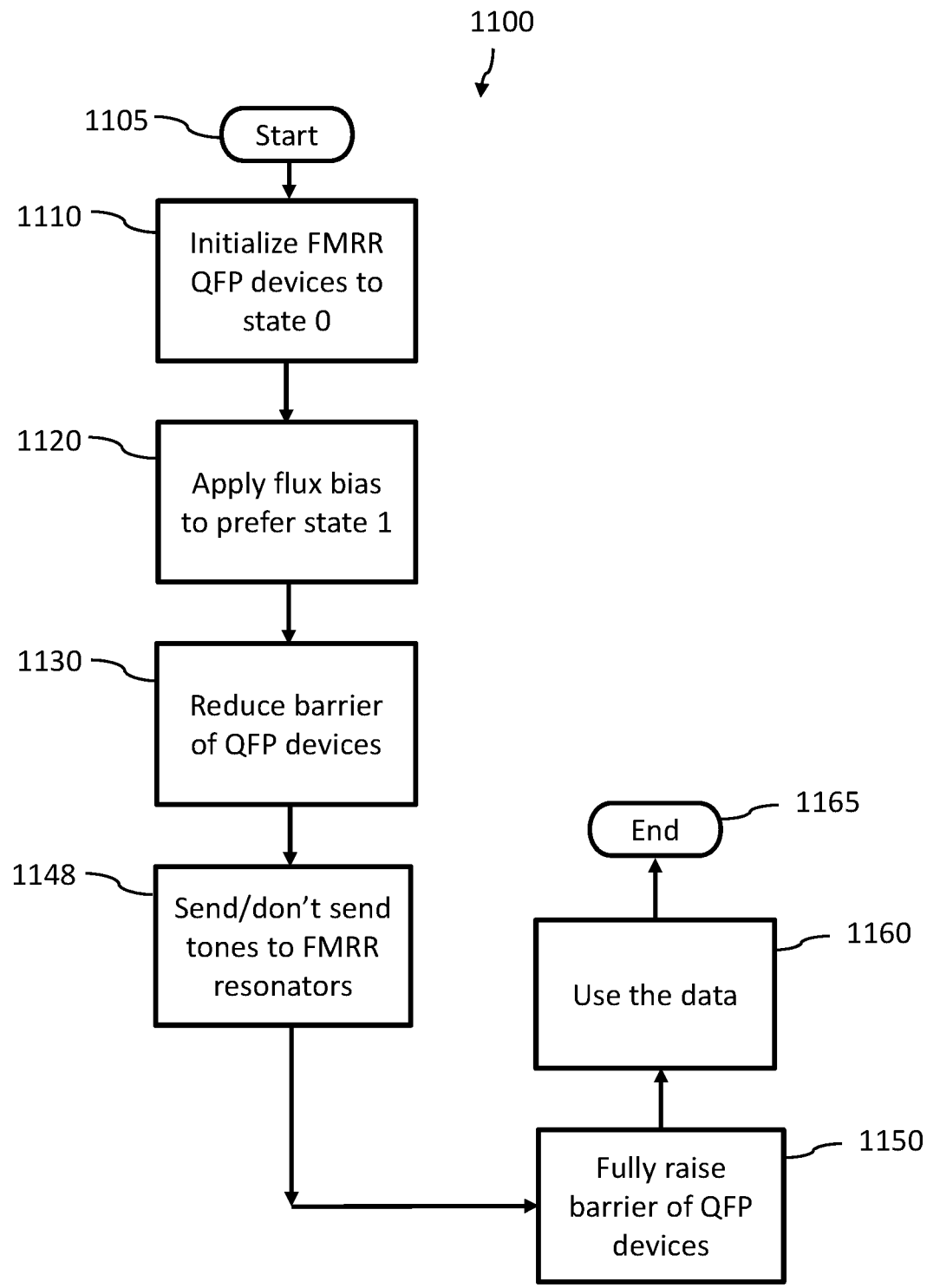
FIG. 11 is a flow chart illustrating a method for using frequency multiplexed resonator technology to transmit data to a superconducting device according to at least another implementation.

FIG. 11 is a flow chart illustrating a method 1100 for using frequency multiplexed resonator technology to transmit data to a superconducting device according to another exemplary implementation. Acts 1105 to 1130, and acts 1150 to 1165 are the same as (or at least similar to) acts 1005 to 1030 and acts 1050 to 1065 of FIG. 10 respectively. Acts 1040 and 1045 of FIG. 10 can be combined into a single act 1148 as shown in FIG. 11. With reference to FIG. 11, at 1148, the computing system decides whether to send a tone to each of the superconducting resonators, and then transmits a microwave signal via the transmission line to all (or at least some of) the superconducting resonators. The frequency multiplexed microwave signal stimulates the superconducting resonators in parallel.

The presently described technology can load data into a shift register on a quantum processor chip using a frequency multiplexed resonator. The frequency multiplexed resonator readout described above (with reference to FIGS. 1A, 1B, 10, 2A, 2B, 2C, 3, 4, 5, and 6) can be run in reverse to allow data to be passed to the processor. In some implementations, the first stage QFP can be used to rectify a microwave signal in the resonator if a signal is present.

The presently described technology can be used to input data to the processor as well as to readout qubit states from the processor. The same lines can be used for both input and readout.

In some implementations, the device can reduce, or minimize, the impact of microwave currents in the resonator on the attached QFP. To circumvent this, a large SENSE SQUID flux bias can be used to break the symmetry of the device, to allow a microwave flux signal to bias the body of the QFP. In another approach, a portion of the resonator inductance can be used to bias the QFP directly with the resonator current. A benefit of the latter approach is that it can separate the DC flux coupling between the QFP and the SENSE SQUID from the microwave flux coupling between the resonator and the body of the QFP.

Once the data is loaded, the QFP can be read out immediately. The data can be loaded with up to 100% fidelity. Errors can be corrected by repeating the loading sequence.

Figure 12:
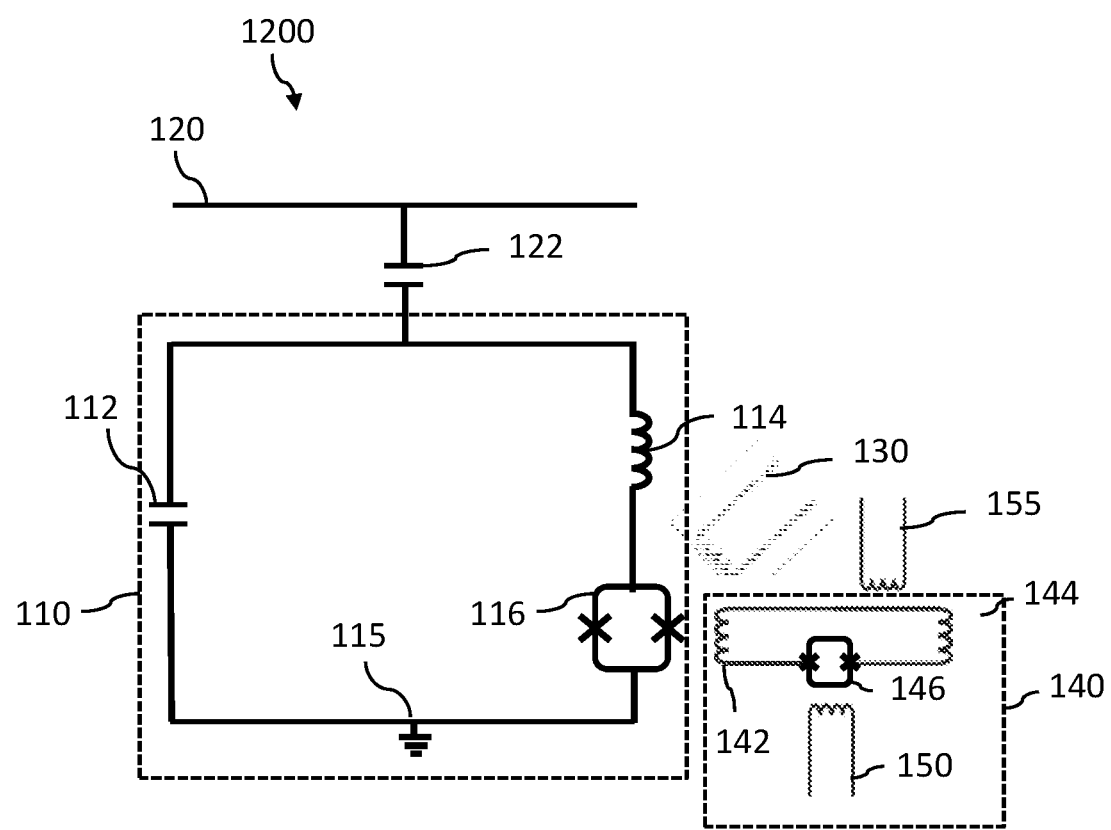
FIG. 12 is a schematic diagram illustrating a frequency multiplexed resonator transceiver according to at least one exemplary implementation.

FIG. 12 is a schematic diagram illustrating a superconducting transceiver circuit 1200 according to at least one exemplary implementation. Superconducting transceiver circuit 1200 comprises a superconducting resonator able to tune a resonator frequency. Superconducting transceiver circuit 1200 is operable as a frequency multiplexed resonator transceiver.

Superconducting transceiver circuit 1200 comprises the elements described above in reference to FIG. 1A, and further comprises a flux bias line 155 operable to apply a flux bias to the last or final shift register stage 140. Shift register stage 140 can, for example, comprise a QFP, and can be communicatively coupled to superconducting resonator 110 for the purposes of reading out the state of a superconducting device and/or loading data into a superconducting device.

In one implementation, data can be loaded into a shift register via the last or final shift register stage 140, and the shift register can be communicatively coupled to a Digital to Analog Converter (DAC) (not shown in FIG. 12). In one implementation, the DAC can be used to apply a bias to a superconducting qubit.

Figure 13A:
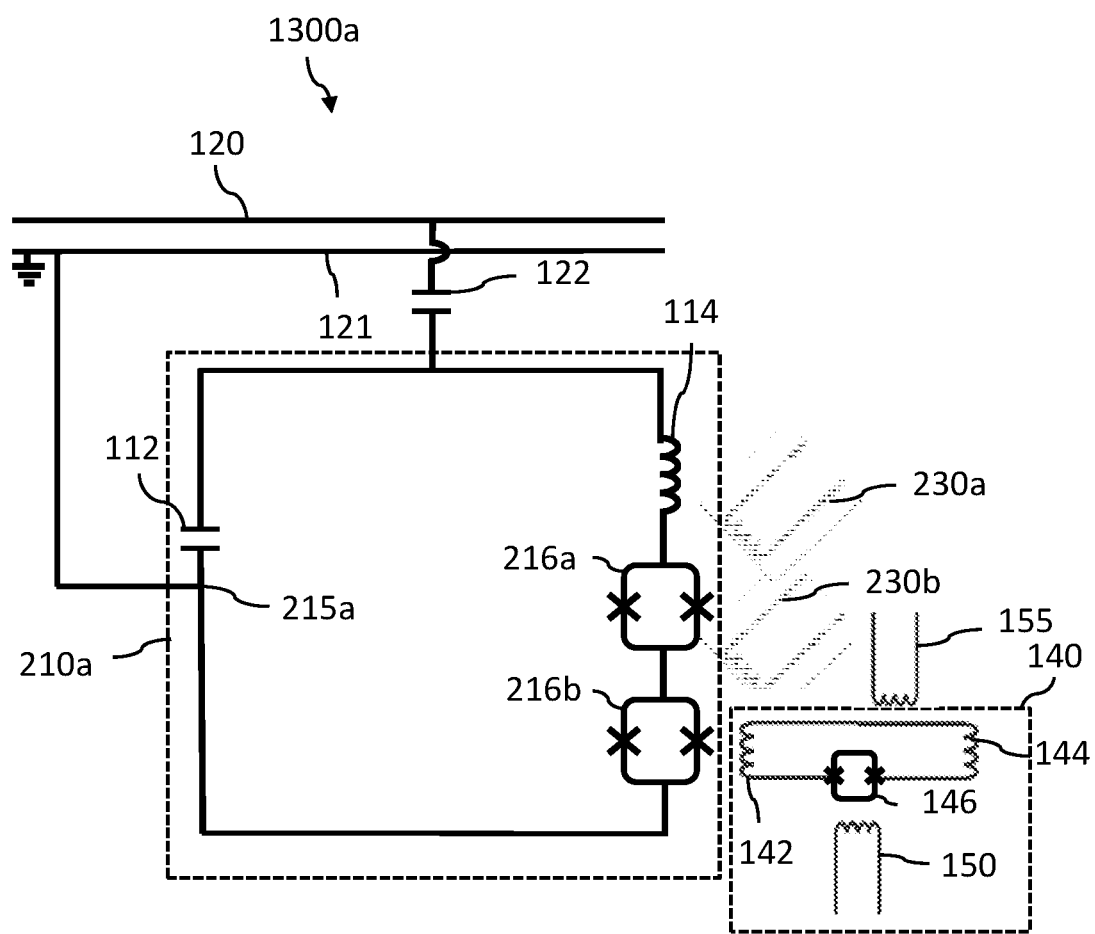
FIG. 13A is a schematic diagram illustrating a frequency multiplexed resonator transceiver comprising a superconducting resonator with two SQUID loops according to at least one exemplary implementation.

FIG. 13A is a schematic diagram illustrating a superconducting transceiver circuit 1300a comprising a superconducting resonator with two SQUID loops according to at least one exemplary implementation. Superconducting transceiver circuit 1300a is operable as a frequency multiplexed resonant transceiver.

As described with reference to FIG. 2A, SQUID loops 216a and 216b advantageously enable independent tuning of the resonance frequency and the sensitivity of superconducting resonator 210a by adjusting the flux bias in SQUID loops 216a and 216b.

Components of superconducting transceiver circuit 1300a labeled with the same numbers as in superconducting circuit 100 of FIG. 1A are similar or even identical to those described in reference to FIG. 1A. For example, capacitance 112 of superconducting circuit 1300a can be a parallel plate capacitor, and inductance 114 of superconducting circuit 1300a can be a niobium spiral inductor. Inductance 114 can be implemented using an inductor (e.g., a spiral inductor) comprising a high kinetic inductance material (e.g., TiN or WSi). As described with reference to FIG. 2A, interfaces 230a and 230b can provide flux bias to SQUID loops 216a and 216b respectively. Once a suitable operating point has been found (see below), the flux biases provided by interfaces 230a and 230b can be static. This advantageously allows the circuit to use an array of flux DACs requiring only a few wires to program. The two tunable SQUID loops 216a and 216b do not need an independent analog control line for each superconducting resonator 210a.

Superconducting transceiver circuit 1300a comprises the elements of FIG. 2A. Superconducting transceiver circuit 1300a further comprises an interface 155 operable to apply a flux bias to QFP 140, as described with reference to FIG. 11.

Figure 13B:
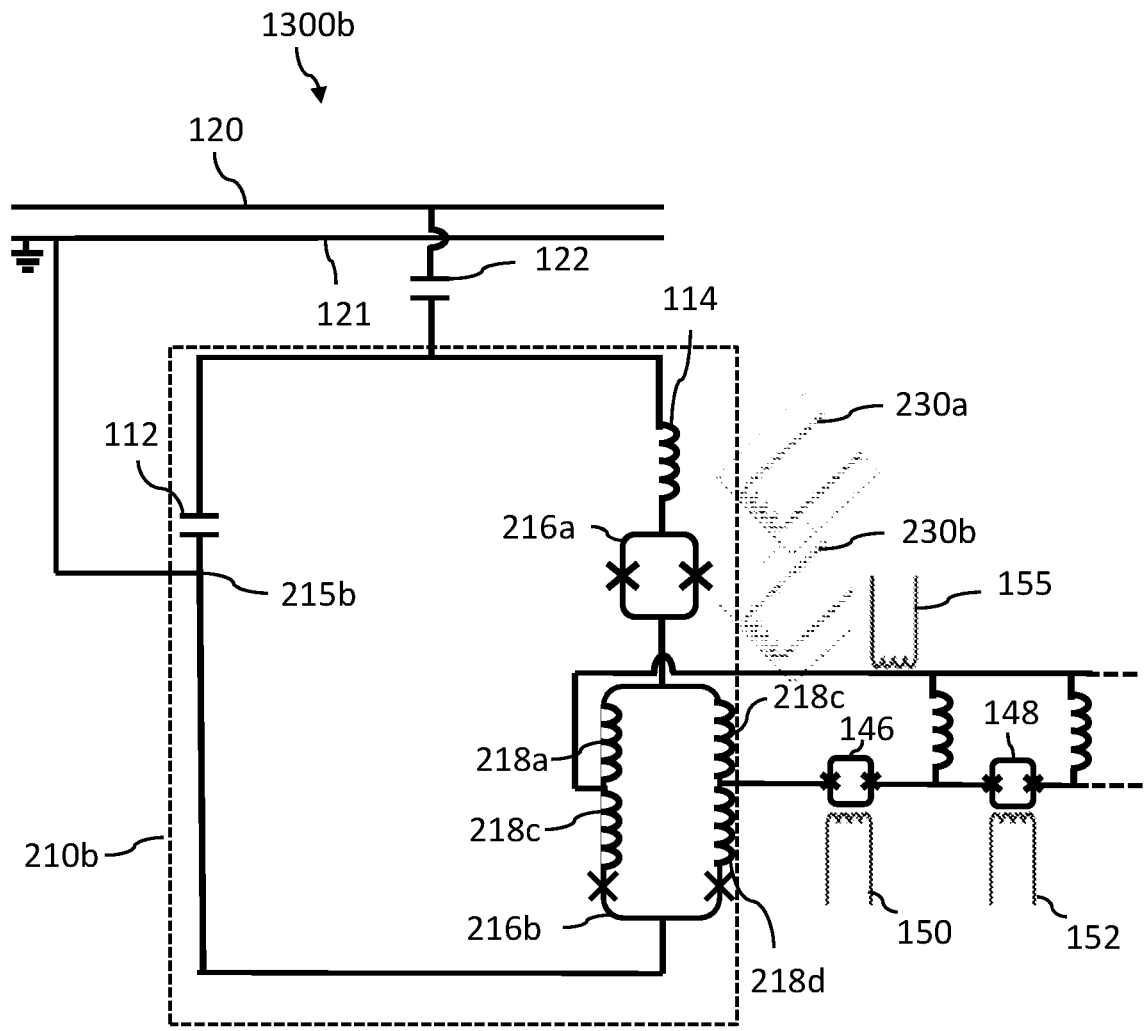
FIG. 13B is a schematic diagram illustrating a frequency multiplexed resonator transceiver comprising a superconducting resonator with two SQUID loops according to at least another exemplary implementation.

FIG. 13B is a schematic diagram illustrating a superconducting transceiver circuit 1300b comprising a superconducting resonator with two SQUID loops according to at least another exemplary implementation. Superconducting transceiver circuit 1300b is operable as a frequency multiplexed resonator transceiver.

Superconducting transceiver circuit 1300b comprises the elements of FIG. 2B. Superconducting transceiver circuit 1300b further comprises an interface 155 operable to apply a flux bias to a last stage QFP 140a, as described with reference to FIG. 11.

In the example embodiment of FIG. 13B, the coupling between SQUID loop 216b (referred to in the present application as the SENSE SQUID) and last stage QFP 140a is galvanic coupling. When there is no flux in the SENSE SQUID, microwave current will be evenly split on both sides of the SQUID. Since the galvanic coupling to the QFP is symmetric, the result is zero flux coupling into last stage QFP 140a. The symmetry can be broken by introducing a large flux bias into the SENSE SQUID. The circulating current will combine with the microwave current in a manner that depends on the non-linearity of the SQUID junctions. The result can be a net flux signal into last stage QFP 140a.

In another exemplary implementation, the resonator is coupled directly to the QFP. The coupling is sufficient to load the QFP deterministically when in a metastable state while not destroying data when in a fully latched state.

In at least one exemplary implementation, the superconducting device is stimulated after partial annealing (reduction of the barrier) at the resonant frequency.

In another exemplary implementation, the resonator is stimulated after partial annealing using a fast sweep by a Vector Network Analyzer (VNA). The sweep of the VNA can be centered, or least approximately centered, on the resonance frequency of the resonator. The bandwidth of the sweep can be set to a value that is less than the resonator linewidth, and the sweep can use a handful of points within the resonance. The bandwidth of the sweep can be selected to avoid, or at least reduce, overlap with the linewidth of an adjacent resonance.

In an example implementation, the sweep can be achieved with a trigger signal output from a DAC card, and sent to the VNA. The waveform can include a sufficiently long delay to allow the sweep to finish before full annealing and readout. For example, the delay can be a few milliseconds.

Figure 13C:
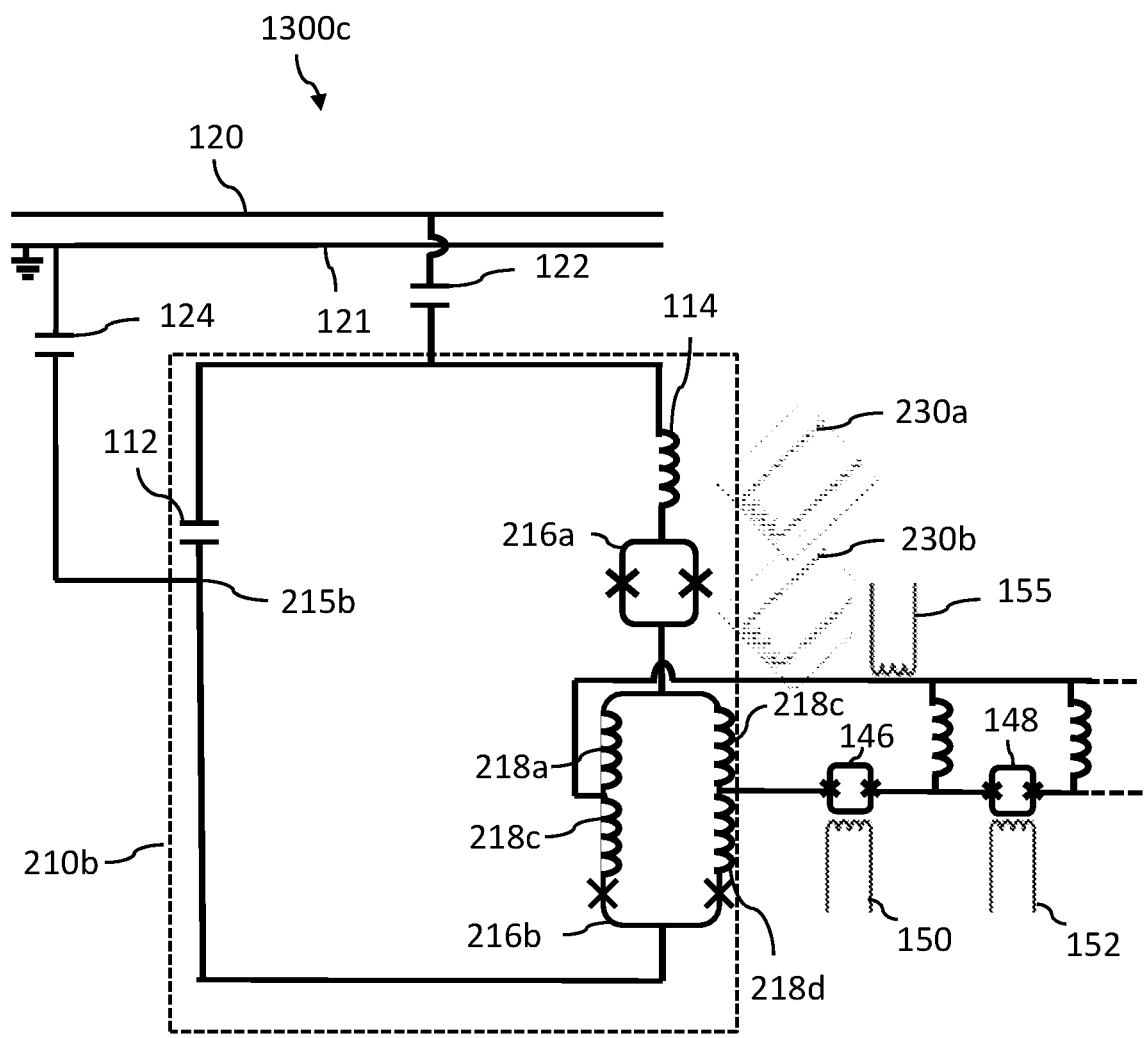
FIG. 13C is a schematic diagram illustrating a frequency multiplexed resonator transceiver comprising a superconducting resonator with two SQUID loops according to at least another exemplary implementation.

FIG. 13C is a schematic diagram illustrating a superconducting transceiver circuit 1300c comprising a superconducting resonator with two SQUID loops according to at least another exemplary implementation. Superconducting transceiver circuit 1300c is operable as a frequency multiplexed resonator transceiver, and is able to tune the resonator frequency and sensitivity independently of each other.

Superconducting transceiver circuit 1300c comprises the elements of FIG. 2C. Superconducting transceiver circuit 1300c further comprises an interface 155 operable to apply a flux bias to a last stage QFP 140a, as described with reference to FIG. 11.

Superconducting transceiver circuit 1300c is connected at node 215c to the ground 121 of transmission line 120 via a coupling capacitor 124. In other respects, superconducting transceiver circuit 1300c is the same as or similar to superconducting transceiver circuit 1300b.

Components of superconducting transceiver circuits 1300a, 1300b, and 1300c of FIGS. 13A, 13B, and 13C, respectively, labeled with the same numbers as in superconducting circuit 100 of FIG. 1A can be similar or even identical to those as described in reference to FIG. 1A. For example, capacitance 112 of superconducting circuits 1300a, 1300b, and 1300c can be a parallel plate capacitor, and inductance 114 of superconducting transceiver circuits 1300a, 1300b, and 1300c can be a niobium spiral inductor. Inductance 114 can be implemented using an inductor (e.g., a spiral inductor) comprising a high kinetic inductance material (e.g., TiN or WSi).

In superconducting transceiver circuits 1300a, 1300b, and 1300c, superconducting resonator 210a is connected at node 215a to ground, for example to the ground 121 of transmission line 120. In superconducting transceiver circuit 1300c, superconducting resonator 210a is connected at node 215a to ground via capacitor 124.

Figure 14:
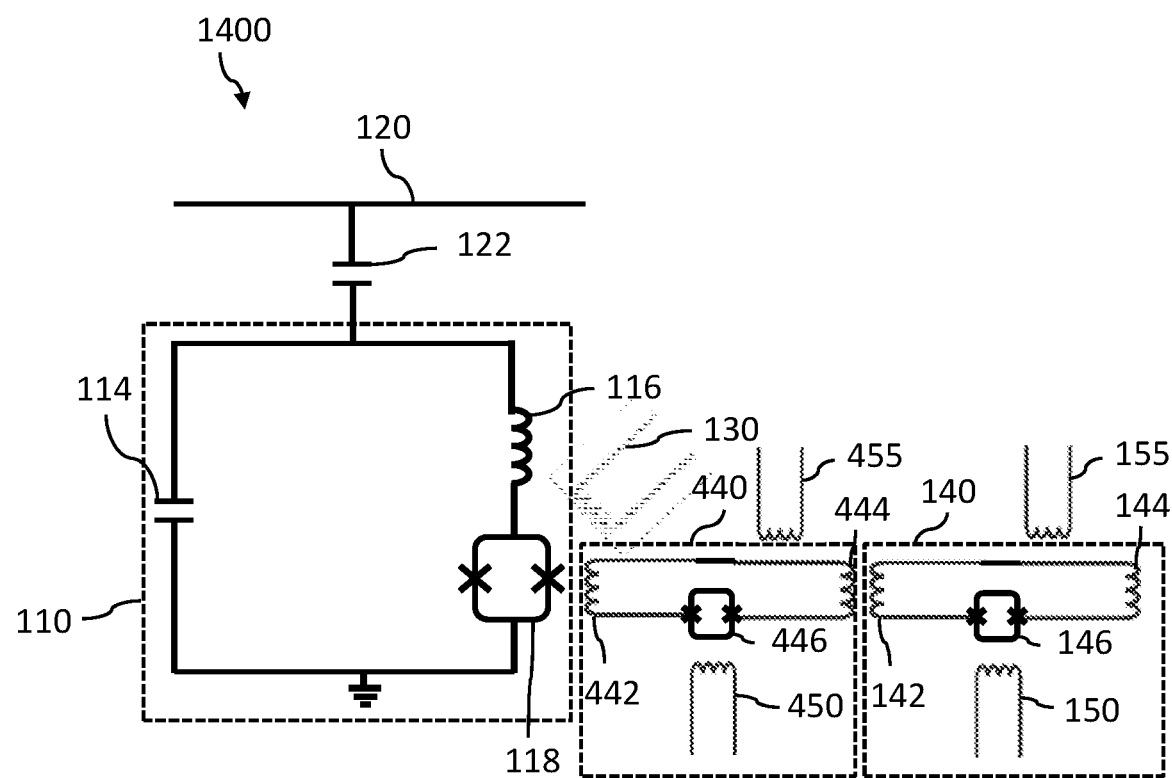
FIG. 14 is a schematic diagram illustrating a frequency multiplexed resonator transceiver comprising the superconducting resonator of FIG. 12.

FIG. 14 is a schematic diagram illustrating an example embodiment of a superconducting transceiver circuit 1400 comprising superconducting resonator 110 of FIG. 12. Superconducting transceiver circuit 1400 is operable as a frequency multiplexed resonator transceiver, and is advantageously operable to independently tune the resonator frequency and sensitivity. Superconducting transceiver circuit further comprises interface 130 and last or final shift register stage 140, both as described with reference to FIG. 1A.

Superconducting transceiver circuit 1400 comprises the elements of superconducting circuit 400 of FIG. 4. Superconducting transceiver circuit 1400 further comprises a tunable coupler 440 in between superconducting resonator 110 and last or final shift register stage (or QFP) 140. Superconducting transceiver circuit 1400 enables independent tuning of the resonance frequency and the sensitivity to QFP flux, provided the variable loading of superconducting resonator 110 by tunable coupler 440 is taken into account.

Tunable coupler 440 comprises, for example, inductances 442 and 444, and DC SQUID 446. Superconducting transceiver circuit 400 further comprises interface 450 operable to apply a flux bias to tunable coupler 440, and thereby to adjust the strength of coupling between SQUID loop 216b and last stage QFP 140.

In some embodiments, the frequency multiplexed resonator input system described above, which can be used to input data to superconducting devices, is used in combination with the frequency multiplexed resonator readout system also described in the present disclosure (with reference to FIGS. 1A, 1B, 10, 2A, 2B, 2C, 3, 4, 5, and 6). In other embodiments, the frequency multiplexed resonator input system described above is used in combination with other readout systems or circuits. For example, in one of the other embodiments, the frequency multiplexed resonator input system is used in combination with the superconducting flux qubit readout system described in U.S. Pat. No. 8,854,074.

An example embodiment of a frequency multiplexed resonator input/output system is illustrated in FIG. 5 (described above with reference to the readout system). The return pathway in FIG. 5 comprises DC block 585, circulators 584 and 583, amplifiers 575, 566, 564, and 562, attenuator 570, mixer 560, filters 527a and 527b, and ADC 526a and 526b. If the system is to be used for inputting data to the superconducting devices only (and no readout), then the return pathway is not required.

Figure 15A:
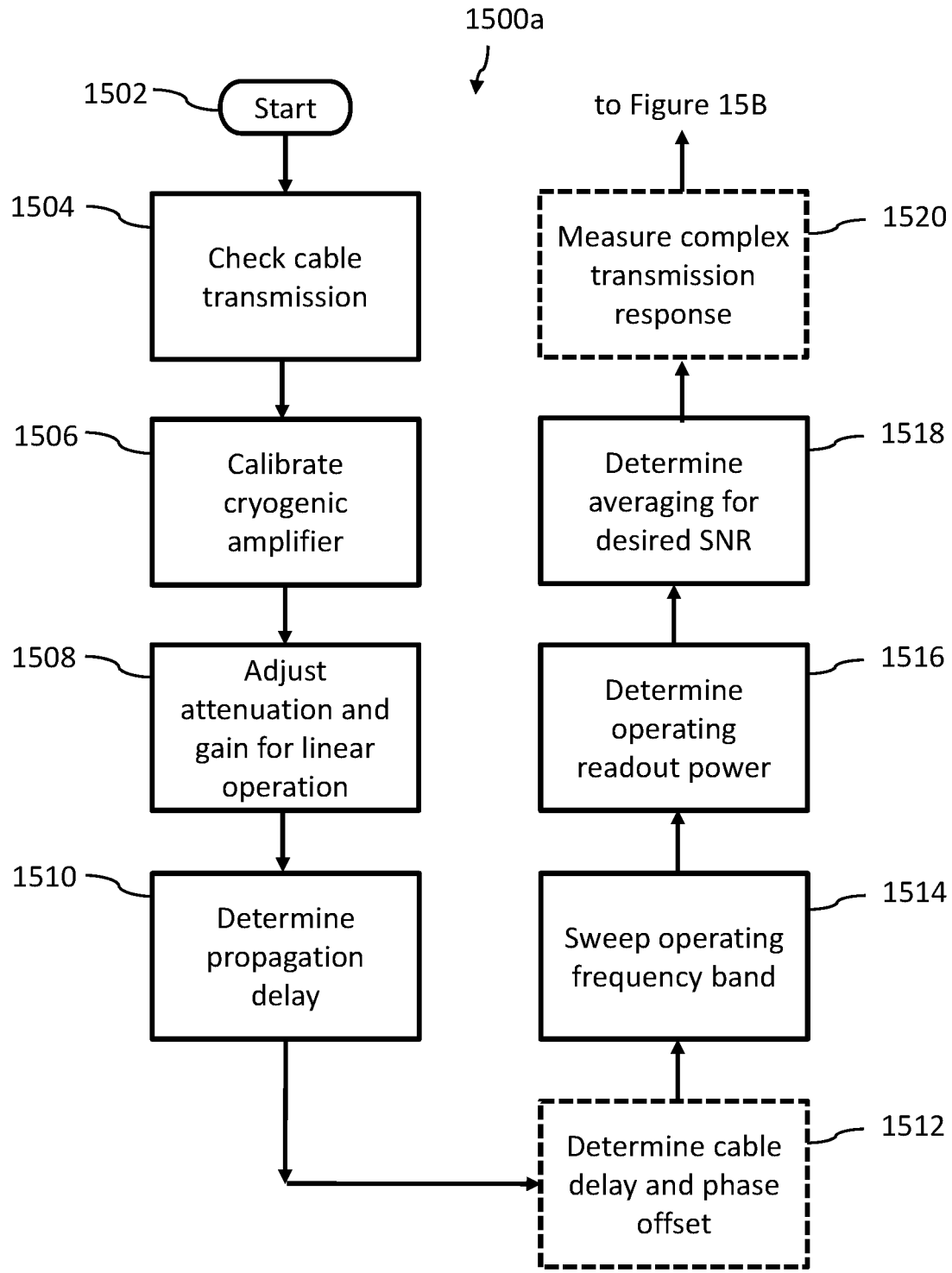
FIGS. 15A, 15B, and 15C are flow charts illustrating a method for calibrating a frequency multiplexed resonator transceiver according to the systems and methods described in the present application.
Figure 15B:
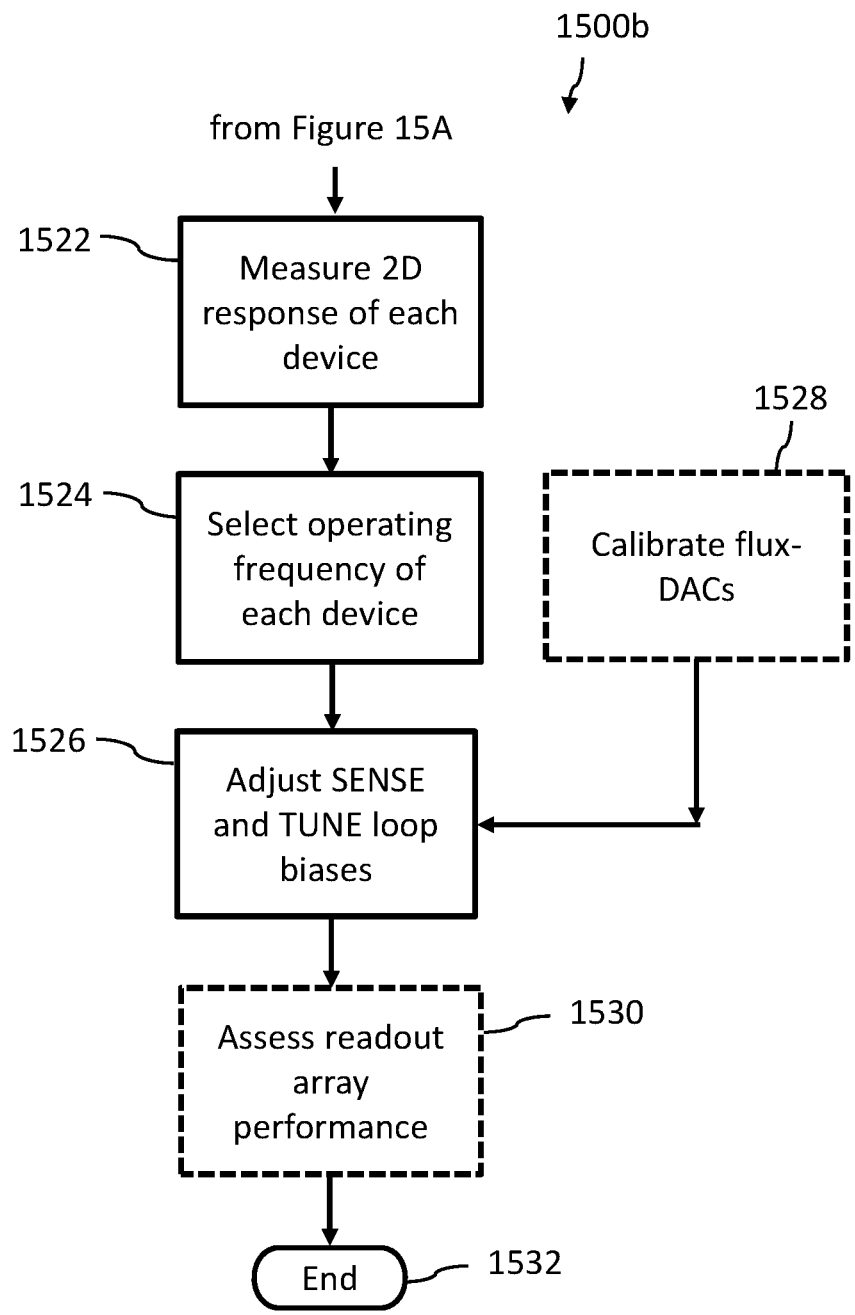
Figure 15C:
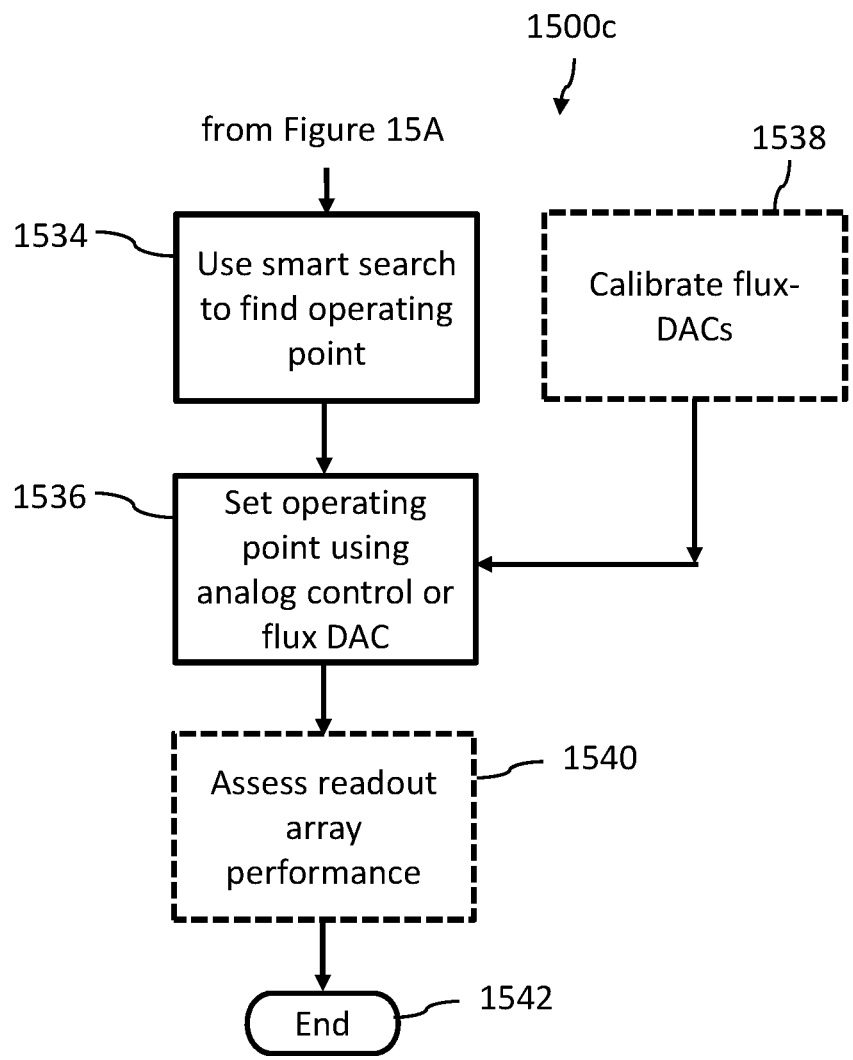

A superconducting readout system can include a) a microwave transmission line, and b) a microwave superconducting resonator communicatively coupled to the microwave transmission line. The microwave superconducting resonator can be communicatively coupled to a superconducting quantum processor. Calibration of the superconducting readout system can include one or more of the activities described in FIGS. 15A, 15B, and 15C, and in the following paragraphs. FIGS. 15A, 15B, and 15C are flow charts illustrating a method for calibrating a frequency multiplexed resonator transceiver according to the systems and methods described in the present application.

FIG. 15A is a flow chart illustrating an example of a first portion 1500a of a method for calibrating a frequency multiplexed resonator technology to transmit data to a superconducting device and/or read out data from a superconducting device, according to at least one exemplary implementation. The superconducting device can, for example, be an element of a superconducting classical processor. Alternatively, the superconducting device can, for example, be an element of a superconducting quantum processor.

The frequency multiplexed resonator technology used to transmit data to a superconducting device and/or read out data from a superconducting device includes at least one SQUID. Some implementations are illustrated in FIGS. 1, 2A, 2B, 2C, 4, 5, 7, 8, 9, 12, 13A, 13B, 13C, and 14, for example.

In one implementation, method 1500a is executed by a computing system, such as a hybrid computing system comprising a digital computer and an analog computer. Method 1500 includes acts 1502-1520, though those skilled in the art will appreciate that in alternative implementations certain acts may be omitted and/or additional acts may be added. Those skilled in the art will appreciate that the order of the acts is shown for exemplary purposes only and may change in alternative implementations.

Method 1500a starts at 1502, for example in response to a powering up of a readout system (e.g., readout system 500 of FIG. 5) or invocation of a routine.

At 1504, the computing system checks cable transmission. In one implementation of the systems and methods described in the present application, the microwave transmission line is checked, before communicatively coupling the microwave superconducting resonator to the superconducting quantum processor, at a temperature at which the microwave transmission line is not superconducting. The temperature at which the microwave transmission line is checked can be room temperature. Room temperature, in the present application, refers to a temperature in the range 15° C. to 25° C. The temperature at which the microwave transmission line is checked can be another suitable temperature above the temperature at which the microwave transmission line becomes superconducting.

Checking the microwave transmission line can include checking one or more of each of the following—cables, connectors, attenuators (e.g., attenuators 581 and 582 of FIG. 5), filters (e.g., filters 525a, 525b, 527a, and 527b), circulators (e.g., circulators 583 and 584 of FIG. 5), and amplifiers (e.g., amplifier 580 of FIG. 5).

Since the microwave transmission line is non-superconducting while being checked, and typically has high impedance, it can be more effective to check the microwave transmission line before communicatively coupling the microwave superconducting resonator to the superconducting quantum processor. If the microwave transmission is sufficiently short, or has sufficiently low impedance, the microwave transmission line can be checked after communicatively coupling the microwave superconducting resonator to the superconducting quantum processor.

One approach is to use an instrument to measure either an amplitude of a transmitted microwave signal or an amplitude and a phase of a transmitted microwave signal. In one implementation, the instrument includes a vector-network analyzer (VNA). In another implementation, the instrument includes a microwave source and a diode detector. The instrument may be a standalone piece of equipment, or integrated with other electronics of the computing system. Typically, checking cable transmission uses only the amplitude of the transmitted microwave signal. The amplitude is also referred to in the present application as $|S_{21}|$, and can be expressed in dBm.

The measured amplitude can be compared to an expected transmission that has been determined previously by measuring a transmission of each component individually. It is desirable that cable transmission deviates by less than a determined threshold from the expected transmission. In one implementation, it is desirable that deviations are less than 2 dB. Deviations can be a result of imperfect connections between cabling and components. Larger deviations may indicate a broken component or a damaged cable.

At 1506, the computing system calibrates a cryogenic amplifier. In one implementation of the systems and methods described in the present application, one or more cryogenic amplifiers are calibrated at a cryogenic temperature (e.g., at a temperature of several mK). Calibration of a cryogenic amplifier can include measuring transmission using at least one of a) a vector network analyzer, and b) a transmission power measurement over a narrow bandwidth. The results can be used to assess the health of the chain of microwave components (including, for example, cables, connectors, attenuators, filters, circulators, and amplifiers), and to attempt to optimize a gain of the cryogenic amplifier.

In one approach, the cryogenic amplifier is adjusted to attempt to maximize a signal-to-noise ratio. Adjusting the cryogenic amplifier to attempt to maximize a signal-to-noise ratio may cause the cryogenic amplifier to operate at a gain less than a maximum gain of the amplifier. A benefit of operating the cryogenic amplifier at a gain less the maximum gain is that dissipation can be at least reduced, and heating of the fridge can be reduced.

At 1508, the computing system adjusts attenuation and gain for linear operation. In one implementation of the systems and methods described in the present application, attenuation and gain between stages are adjusted to increase linearity of operation. Calibration can include adjusting one or more analog components in the microwave transmission line to cause them to operate nearer to their optimal drive power—without saturation or clipping (which can occur when the power is too high), and without introducing additional noise (which can occur when the power is too low).

It can be desirable for the signal on the microwave transmission line to use more of the available dynamic range of the analog-to-digital converter (ADC) when the signal is not close to a resonant frequency of a superconducting resonator. A benefit of the foregoing is that the impact of digitization noise can be reduced. A resonant frequency of a superconducting resonator is also referred to in the present application as a resonance frequency.

Calibration can include adding or removing one or more analog components from the microwave transmission line to achieve desirable power levels along the microwave transmission line at room temperature.

Adjusting attenuation and gain can include adding or removing attenuators, adding or removing amplifiers, and/or adjusting the gain of amplifiers. It can be practical to add and remove physical attenuators and amplifiers in the room temperature portion of the circuit. Adjusting attenuation and gain may not be necessary where the linearity specification of components is known, and levels have been adjusted in advance so that components are able to operate within their linear range. Variations in the operating point of the cryogenic amplifier, or unexpected behavior of the microwave transmission, may necessitate adjusting attenuation and gain for linear operation, for example by adding or removing room temperature attenuators and amplifiers, and/or by adjusting the gain of amplifiers. One of the more common adjustments is to add or remove attenuators on the output side of the microwave chain at room temperature, either before or after the 2nd stage amplifier.

At 1510, the computing system determines a propagation delay in the chain of microwave components. In one implementation of the systems and methods described in the present application, a propagation delay of the microwave transmission line is determined. Determining the propagation delay can include a) outputting a signal from the readout electronics digital-to-analog converter (DAC), b) sampling the ADC at the same time as outputting the signal from the readout electronics DAC, c) measuring the time of arrival of the signal at the ADC, and d) determining the propagation delay from the difference between the time the signal was output by the DAC to the time of its arrival at the ADC. The signal output by the electronics DAC can be a pulse or a step signal, for example.

In one approach, an impulse or square wave is transmitted by the source electronics, and its time of arrival at the detector electronics relative to the time it left the source electronics is measured.

At 1512, the computing system optionally determines cable delay and phase offset. In one implementation of the systems and methods described in the present application, a cable delay and a phase offset due to a length of cabling between the readout electronics DAC and the ADC are determined. One approach includes performing a frequency sweep, and fitting a straight line to measured phase (also referred to in the present application as arg $S_{21}$) as a function of frequency. The cable delay can be determined from a slope of the straight line, and the phase offset can be determined from an offset (y-intercept) of the straight line.

The value of the cable delay and the phase offset can be used to reduce the dimensionality of a fit to a measurement response of a device such as a frequency multiplexed resonant transceiver where the fit is used to extract parameters of the device.

At 1514, the computing system sweeps an operating frequency band. In one implementation of the systems and methods described in the present application, at least approximate detector operating frequencies are estimated by sweeping a frequency band. One approach is to attempt to optimize the signal power for the chain of components in the microwave transmission line, and then perform a vector network analysis to find a respective resonant frequency of each superconducting resonant detector. It is desirable the sweep of the frequency band includes a sweep of an expected operating bandwidth of the superconducting resonators. The expected operating bandwidth of the superconducting resonators is also referred to in the present application as a nominal operating bandwidth of a microwave superconducting resonator. The sweep can be performed with the respective SQUID loops of each of the superconducting resonators in an unbiased state.

Determining a resonant frequency of a microwave superconducting resonator can include at least one of finding a pronounced dip in the gain of a complex transmission response of the superconducting readout system, and a fast change in the phase of the complex transmission response of the superconducting readout system. A pronounced dip in the gain is also referred to in the present application as a dip in the gain that exceeds a threshold value for the dip in the gain. The threshold value for the dip in the gain can be defined or determined to cause the method to find a pronounced dip in the gain. A pronounced dip in the gain can be one that indicates a resonant frequency of a microwave superconducting resonator. A fast change in the phase is also referred to in the present application as a rate of change of phase that exceeds a threshold value for the rate of change of phase. The threshold value for the rate of change of phase can be defined or determined to cause the method to find a fast change in phase. A fast change in phase can be one that indicates a resonant frequency of a microwave superconducting resonator.

At 1516, the computing system determines an operating readout power. A frequency multiplexed resonant transceiver can exhibit nonlinear behavior at a sufficiently high drive power. In one implementation of the systems and methods described in the present application, a respective upper bound to an operating drive power is determined for each frequency multiplexed resonant transceiver. The respective upper bound is an upper bound on drive power before onset of nonlinear behavior in each frequency multiplexed resonant receiver.

One approach is to measure the resonance of each frequency multiplexed resonant receiver as a function of drive power, and then to fit the function, e.g., via a processor, to a nonlinear model to determine the respective upper bound on the drive power before nonlinear distortion exceeds a predetermined threshold.

It can be desirable to use a sufficiently large operating readout power to provide a sufficiently high signal-to-noise ratio. A higher signal-to-noise ratio usually results in a higher readout fidelity.

As described above, one factor that can constrain the operating readout power is device non-linearity at high values of operating readout power. Constituent Josephson junctions and/or kinetic inductances can cause non-linearity in devices. In some implementations, a tradeoff is performed between selecting a lower critical current of a Josephson junction which is generally preferred for responding to a QFP signal, and a higher critical current which is generally preferred for handling a higher operating readout power.

Another factor that can constrain the operating readout power is dissipation of energy by superconducting resonators on an integrated circuit such as a superconducting quantum processor. A higher operating readout power generally results in more dissipation, and more heating of the integrated circuit.

At 1518, the computing system determines a suitable averaging protocol to achieve a desired signal-to-noise ratio (SNR). In one implementation of the systems and methods described in the present application, a desired signal-to-noise level for a selected readout electronics DAC output power is achieved by averaging. Calibration includes determining the averaging protocol.

In one implementation, multiple measurements of a readout of a qubit state are averaged. One approach to averaging is to turn on the electronics, wait a few resonator time constants for the transmission to stabilize, sample for a length of time, average the samples taken during the length of time, and then ring down the resonator. In one implementation, averaging includes unweighted summation of samples. In another implementation, averaging includes weighting of samples. For example, sampling can occur during a ring-up period and/or a ring-down period of the resonator. Averaging can include applying a weighting to samples during the ring-up and/or the ring-down period. A benefit of weighted averaging may be a reduced overall readout cycle time.

At 1520, the computing system optionally measures a complex transmission response. In one implementation of the systems and methods described in the present application, a respective set of parameters defining characteristics of each frequency multiplexed resonant transceiver is extracted. One approach is to measure a respective complex transmission response for each frequency multiplexed resonant transceiver, and perform a fit of the data to a suitable predefined function. An example of a suitable predefined function is as follows:

$$S_{21} = 1 - \frac{Q_r}{Q_c} \frac{1}{1 + 2iQ_r x}$$

where $S_{21}$ is transmission data, $x=(f-f_0)/f_0$ is the fractional detuning from resonance, f is frequency, $f_0$ is a resonant frequency, $Q_r$ is a resonator intrinsic quality factor, and $Q_r$ is intrinsic quality factor of a capacitance coupling the resonator to the transmission line.

Another example, and one that includes non-ideal properties such as cable delay and phase offset (see above), can be found in P. J. Petersan and S. M. Anlage, "Measurement of resonant frequency and quality factor of microwave resonators: Comparison of methods", J. Appl. Phys., Vol. 84, No. 6, 15 Sep. 1998.

Parameters defining characteristics of a frequency multiplexed resonant transceiver can be used as feedback in a design and fabrication process, to improve and refine characteristics of future devices.

In one implementation, control of first portion 1500a of the method proceeds to FIG. 15B. In another implementation, control of first portion 1500a of the method proceeds to FIG. 15C.

FIG. 15B is a flow chart illustrating an example of a second portion 1500b of a method for using frequency multiplexed resonator technology to transmit data to a superconducting device and/or read out data from a superconducting device, according to at least one exemplary implementation. The superconducting device can, for example, be an element of a superconducting classical processor. Alternatively, the superconducting device can, for example, be an element of a superconducting quantum processor.

The frequency multiplexed resonator technology used to transmit data to a superconducting device and/or read out data from a superconducting device includes at least one SQUID. Some implementations are illustrated in FIGS. 1, 2A, 2B, 2C, 4, 5, 7, 8, 9, 12, 13A, 13B, 13C, and 14, for example.

In one implementation, second portion 1500b of the method for using frequency multiplexed resonator technology to transmit data to a superconducting device and/or read out data from a superconducting device is executed by a computing system, such as a hybrid computing system comprising a digital computer and an analog computer. Second portion 1500b of the method includes acts 1522-1532, though those skilled in the art will appreciate that in alternative implementations certain acts may be omitted and/or additional acts may be added. Those skilled in the art will appreciate that the order of the acts is shown for exemplary purposes only and may change in alternative implementations.

Second portion 1500b of the method starts at 1522 where the computing system measures a two-dimensional (2D) response of each device. In one implementation of the systems and methods described in the present application, a respective two-dimensional response of each frequency multiplexed resonant transceiver to flux in the SENSE and TUNE loops is measured. It can be desirable to at least attempt to optimize the measurement power before measuring the respective two-dimensional response of each frequency multiplexed resonant transceiver. Flux can be applied by analog lines, by one or more calibrated flux DACs, or by a suitable combination of both.

Variations can occur during fabrication of each frequency multiplexed resonant transceiver causing a respective resonant frequency to differ from its designed frequency. It is also desirable for the resonant frequencies to be sufficiently spaced to at least reduce crosstalk between resonators and improve a signal-to-noise ratio for the readout.

At 1524, the computing system selects an operating frequency of each device. In one implementation of the systems and methods described in the present application, a respective operating frequency is selected for each frequency multiplexed resonant transceiver. In one approach, the resonant frequencies are spread out across an operating frequency band at least approximately in regularly spaced intervals (also referred to in the present application as a frequency comb). In one approach, frequencies are selected to lie on a contour such as contour 310 of FIG. 3.

It is desirable for frequencies to be selected to attempt to minimize, or at least reduce, a frequency shift applied to each frequency multiplexed resonant transceiver. Large frequency shifts can result in unstable or noisy behavior. Furthermore, large frequency shifts may be difficult to achieve owing to asymmetry of DC-SQUIDs and/or a limited flux range of the flux DACs (see above). In some instances, calibration includes excluding one or more frequency multiplexed resonant transceivers in an array of frequency multiplexed transceivers to reduce the magnitude of frequency shifts to other frequency multiplexed resonant transceivers in the array.

At 1526, the computing system adjusts one or more SENSE and TUNE loop biases. In one implementation of the systems and methods described in the present application, each of the SENSE and TUNE loop biases is adjusted to achieve a respective desired operating frequency (see above) and sensitivity of each frequency multiplexed resonant transceiver. In one approach, adjustment can follow a contour to the desired sensitivity as described in reference to FIG. 3 above.

Bias selection can include first choosing a contour of constant frequency, and then traversing the contour until a desired sensitivity is reached (See, for example, Whittaker J. D., et al. "A frequency and sensitivity tunable microresonator array for high-speed quantum processor readout", arXiv: 1509.05811v2, April 2016.) Sensitivity is also referred to in the present application as responsivity.

Following the contour can be implemented, for example, by fitting data from the two-dimensional frequency response (see above) to a suitable model. In one implementation, the model is a physical device model. In another implementation, the model is an interpolation scheme, for example, a linear or spline fit.

In an example implementation, resonant frequencies are selected to be regularly spaced in frequency, with a spacing of four linewidths, the resonant frequencies shifting by one linewidth in response to flux quanta in a QFP coupled to a SENSE loop of one of the devices.

In some implementations, adjustment of at least one of the SENSE and TUNE loop biases is performed using an analog control signal. An analog control signal can be provided, for example, by an analog line from electronics at a non-cryogenic temperature such as room temperature. In one implementation, the analog line is a twisted pair. In another implementation, the analog line is single-ended.

In other implementations, adjustment of at least one of the SENSE and TUNE loop biases is performed using one or more flux DACs. At 1528, the computing system calibrates the one or more flux DACs. At 1530, the computing system optionally assesses readout array performance. At 1532, second portion 1500b of the method ends.

FIG. 15C is a flow chart illustrating another example of a second portion 1500c of a method for using frequency multiplexed resonator technology to transmit data to a superconducting device and/or read out data from a superconducting device, according to at least one exemplary implementation. The superconducting device can, for example, be an element of a superconducting classical processor. Alternatively, the superconducting device can, for example, be an element of a superconducting quantum processor.

The frequency multiplexed resonator technology used to transmit data to a superconducting device and/or read out data from a superconducting device includes at least one SQUID. Some implementations are illustrated in FIGS. 1, 2A, 2B, 2C, 4, 5, 7, 8, 9, 12, 13A, 13B, 13C, and 14, for example.

In one implementation, second portion 1500c of the method for using frequency multiplexed resonator technology to transmit data to a superconducting device and/or read out data from a superconducting device is executed by a computing system, such as a hybrid computing system comprising a digital computer and an analog computer. Second portion 1500c of the method includes acts 1534-1540, though those skilled in the art will appreciate that in alternative implementations certain acts may be omitted and/or additional acts may be added. Those skilled in the art will appreciate that the order of the acts is shown for exemplary purposes only and may change in alternative implementations.

Alternative second portion 1500c of the method starts at 1534 where the computing system conducts a smart search to find an operating point for at least one of the superconducting resonators in the readout system. A smart search is defined in the following paragraph in reference to a description of 1536.

At 1536, the computing system sets an operating point using at least one of an analog control signal and a flux DAC. The operating point includes an operating frequency and a sensitivity (also referred to in the present application as a responsivity). In one approach, the computing system is provided with a desired operating frequency and sensitivity for a superconducting resonator, and a resonance frequency of the superconducting resonator as a function of a flux bias in at least one tuning SQUID loop. The computing system measures the frequency and sensitivity at a starting flux in at least one tuning SQUID loop, and adjusts the flux to find a suitable resonant frequency.

In some implementations, the computing system attempts to optimize the operating point. In one implementation, the computing system uses an objective function (for example, a cost function) and a gradient-descent method to find a suitable resonant frequency. In another implementation, the computing system uses a Nelder-Mead method to find a suitable resonant frequency. In yet another implementation, the computing system uses a method that includes calculating a second derivative matrix (for example, a Newton-Raphson method) to find a suitable resonant frequency.

The goal of the computing system is to find a suitable operating point using as few measurements as practically possible, or at least a smaller number of measurements, while being robust with respect to noise and/or a discontinuity in a derivative. A search that meets the goal described in the previous sentence is referred to in the present application as a smart search.

In one implementation of the systems and methods described in the present application, a smart search is used to find a suitable operating point for the readout array. In one approach, a smart search includes a Nelder-Mead search method and/or a Newton-Raphson method). In other approaches, another suitable search method is used. Inputs to the search method can include the desired device frequency and the device response. The method measures the device response in a two-dimensional search space to find a suitable operating point.

The search method should be robust and bounded. Since the device response can exhibit noisy or discontinuous behavior, the search method should be robust to this behavior. Since the device response is periodic, the search method can restrict its search to one period, and therefore should be bounded.

In one implementation of the systems and methods described in the present application, a flux DAC is used to provide flux to a FASTR SENSE loop (such as SQUID loop 216b of FIG. 2A), and a TUNE loop (such as SQUID loop 216a of FIG. 2A). The SENSE and TUNE loops can be controlled using analog lines or using addressable flux DACs. In some implementations, addressable flux DACs are used to reduce the number of lines to the superconducting quantum processor that run, for example, from the electronics at a non-cryogenic temperature such as room temperature.

An addressable flux DAC can be calibrated. One approach to calibration of the flux DAC is to a) determine a change in a resonant frequency of a frequency multiplexed resonant transceiver for each flux quantum stored in a flux DAC that is coupled to the frequency multiplexed resonant receiver (also referred to in the present application as the DAC bases), and b) determine an upper bound on an amount of flux that each flux DAC can provide (also referred to in the present application as the DAC dynamic range and the MAXSFQ).

At 1538, the computing system calibrates the flux DAC.

At 1540, the computing system optionally assesses readout array performance. In one implementation of the systems and methods described in the present application, when the readout array is ready for operation, readout array performance is assessed, for example, by reading out bit patterns from the superconducting quantum processor. The bit patterns can be random bit patterns. The bit patterns can be applied, for example, by loading data into the last stage QFPs coupled to the FASTR (define) SENSE DC-SQUID, and then using the FASTRs to readout the data. A readout error rate can be estimated by repeatedly reading out the bit patterns. The readout error rate can be compared to a desired readout error rate. An example desired readout error rate is one error per 100,000 readout operations.

At 1542, alternative second portion 1500c of the method ends.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to the following: International PCT Patent Publication No. WO2016183213A1 "FREQUENCY MULTIPLEXED RESONATOR INPUT AND/OR OUTPUT FOR A SUPERCONDUCTING DEVICE"; U.S. Provisional Patent Application No. 62/636,043 "SYSTEMS AND METHODS FOR COUPLING A SUPERCONDUCTING TRANSMISSION LINE TO AN ARRAY OF RESONATORS"; U.S. Provisional Patent Application No. 62/672,392 "SYSTEMS AND METHODS FOR ADDRESSING DEVICES IN A SUPERCONDUCTING CIRCUIT"; U.S. Provisional Patent Application No. 62/679,079 "SYSTEMS AND METHODS FOR ADDRESSING DEVICES IN A SUPERCONDUCTING CIRCUIT"; U.S. Provisional Patent Application No. 62/683,253 "SYSTEMS AND METHODS FOR ADDRESSING DEVICES IN A SUPERCONDUCTING CIRCUIT"; U.S. Provisional Patent Application No. 62/725,933 "SYSTEMS AND METHODS FOR OPERATION OF A FREQUENCY MULTIPLEXED RESONATOR INPUT AND/OR OUTPUT FOR A SUPERCONDUCTING DEVICE"; U.S. Pat. No. 8,854,074 "SYSTEMS AND METHODS FOR SUPERCONDUCTING FLUX QUBIT READOUT"; and U.S. Pat. No. 8,169,231 "SYSTEMS, METHODS, AND APPARATUS FOR QUBIT STATE READOUT", are incorporated herein by reference, in their entireties. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of operation of an apparatus, the apparatus comprising a superconducting readout system, the superconducting readout system comprising: a microwave transmission line; a microwave superconducting resonator communicatively coupled to the microwave transmission line, the microwave superconducting resonator comprising a first superconducting quantum interference device (SQUID); and a first interface inductively communicatively coupled to the first SQUID, the first interface selectively operable to apply a first flux bias to the first SQUID, the method comprising:
measuring a resonant frequency of the microwave superconducting resonator in response to the first flux bias;
measuring a sensitivity of the resonant frequency of the microwave superconducting resonator in response to the first flux bias; and
selecting an operating frequency and a sensitivity of the microwave superconducting resonator based at least in part on a variation of the resonant frequency as a function of the first flux bias, wherein selecting an operating frequency and a sensitivity of the microwave superconducting resonator includes adjusting the first flux bias applied to the first SQUID by the first interface.

2. The method of claim 1, wherein the superconducting readout system further comprises a second SQUID and a second interface inductively communicatively coupled to the second SQUID, the second interface selectively operable to apply a second flux bias to the second SQUID, the method further comprising:
measuring a resonant frequency of the microwave superconducting resonator in response to the first and the second flux bias;
measuring a sensitivity of the resonant frequency of the microwave superconducting resonator in response to the first and the second flux bias; and
selecting an operating frequency and a sensitivity of the microwave superconducting resonator based at least in part on the resonant frequency and the sensitivity of the microwave superconducting resonator, wherein selecting an operating frequency and a sensitivity of the microwave superconducting resonator includes adjusting the first and the second flux bias applied to each of the first and the second SQUID by the first and the second interface respectively.

3. The method of claim 1, further comprising at least approximating an operating frequency for the microwave superconducting resonator by sweeping an operating frequency band selected to include a nominal operating bandwidth of the microwave superconducting resonator.

4. The method of claim 3, wherein at least approximating an operating frequency for the microwave superconducting resonator by sweeping an operating frequency band includes:
attempting to optimize a signal power for the microwave transmission line;
performing a measurement of at least one of a gain and a phase of a complex transmission response of the superconducting readout system; and
determining a respective resonant frequency of the microwave superconducting resonator, wherein determining the respective resonant frequency of the microwave superconducting resonator includes at least one of finding a dip in the gain that exceeds a first threshold, and a rate of change in the phase that exceeds a second threshold.

5. The method of claim 4, wherein performing a measurement of at least one of a gain and a phase to determine a respective resonant frequency of the microwave superconducting resonator includes performing a measurement of at least one of a gain and a phase using a vector network analyzer.

6. The method of claim 3, wherein sweeping an operating frequency band selected to include a nominal operating bandwidth of the microwave superconducting resonator includes configuring the first and the second SQUID of the microwave superconducting resonator in an unbiased state.

7. The method of claim 1, the superconducting readout system further comprising a readout electronics digital-to-analog converter (DAC), the method further comprising selecting an output power for the readout electronics DAC, and determining averaging protocol to achieve a defined signal-to-noise at the selected output power of the readout electronics DAC.

8. The method of claim 1, further comprising determining at least one of a propagation delay through the superconducting readout system, a microwave transmission line delay, and a microwave transmission line phase offset.

9. The method of claim 8, wherein determining a microwave transmission line delay and a microwave transmission line phase offset includes:
performing a frequency sweep;
fitting a straight line to a measured phase as a function of frequency;

estimating a microwave transmission line delay from a slope of the straight line; and estimating the phase offset from a y-intercept of the straight line.

10. The method of claim 1, the superconducting readout system further comprising a cryogenic amplifier, the method further comprising calibrating the cryogenic amplifier.

11. The method of claim 1, the superconducting readout system further comprising an amplifier and an attenuator, the method further comprising adjusting at least one of a gain of the amplifier and an attenuation of the attenuator to provide at least approximately linear operation of the superconducting readout system.

12. The method of claim 1, further comprising measuring a complex transmission response of the microwave transmission line.

13. The method of claim 1, wherein selecting an operating frequency and a sensitivity of the microwave superconducting resonator includes selecting an operating frequency and a sensitivity of the microwave superconducting resonator by defining an objective function and attempting to optimize the objective function by adjusting the first flux bias.

14. The method of claim 13, wherein attempting to optimize the objective function includes using at least one of a gradient-descent method, a Nelder-Mead method, and a Newton-Raphson method.

15. The method of claim 1, wherein measuring a resonant frequency of the microwave superconducting resonator in response to the first flux bias includes measuring a resonant frequency by a vector-network analyzer.

16. The method of claim 1, wherein measuring a sensitivity of the resonant frequency of the microwave superconducting resonator in response to the first flux bias includes measuring a sensitivity of the resonant frequency of the microwave superconducting resonator by a current source and a vector-network analyzer (VNA).

17. The method of claim 1, further comprising assessing performance of the superconducting readout system.

18. The method of claim 1, wherein the method of operation calibrates the superconducting readout system.

19. The method of claim 1, wherein the method of operation selects an operating point for the superconducting readout system.

20. A computing system comprising:
at least one nontransitory processor-readable storage medium that stores at least one of processor-executable instructions or data; and
at least one processor communicatively coupled to the at least one nontransitory processor-readable storage medium; and
a superconducting readout system communicatively coupled to the at least one processor, the superconducting readout system comprising: a microwave transmission line; a microwave superconducting resonator communicatively coupled to the microwave transmission line, the microwave superconducting resonator comprising a first superconducting quantum interference device (SQUID); and a first interface inductively communicatively coupled to the first SQUID, the first interface selectively operable to apply a first flux bias to the first SQUID, the at least one processor operable to:

measure a resonant frequency of the microwave superconducting resonator in response to the first flux bias;

measure a sensitivity of the resonant frequency of the microwave superconducting resonator in response to the first flux bias; and select an operating frequency and a sensitivity of the microwave superconducting resonator based at least in part on a variation of the resonant frequency as a function of the first flux bias, wherein selecting an operating frequency and a sensitivity of the microwave superconducting resonator includes adjusting the first flux bias applied to the first SQUID by the first interface.

* * * * *